United States Patent
Lin et al.

(10) Patent No.: US 11,216,048 B1
(45) Date of Patent: Jan. 4, 2022

(54) SYSTEM AND METHOD FOR CONTROLLING COMPUTER COOLING USING IDEAL COOLING SYSTEM SETTINGS, ACTUAL COOLING SYSTEM SETTINGS, AND COMPUTER COMPONENT DATA

(71) Applicant: ZT Group Int'l, Inc., Secaucus, NJ (US)

(72) Inventors: Ting Yu Lin, Bloomfield, NJ (US); Daniel Ferrone, Lyndhurst, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 173 days.

(21) Appl. No.: 15/404,516

(22) Filed: Jan. 12, 2017

Related U.S. Application Data

(63) Continuation-in-part of application No. 15/071,547, filed on Mar. 16, 2016, now Pat. No. 10,222,843.

(51) Int. Cl.
*G06F 1/20* (2006.01)
*G06F 1/26* (2006.01)
*G06F 1/3296* (2019.01)

(52) U.S. Cl.
CPC .............. *G06F 1/206* (2013.01); *G06F 1/266* (2013.01); *G06F 1/3296* (2013.01)

(58) Field of Classification Search
CPC ......... G06F 1/206; G06F 1/3296; G06F 1/266
See application file for complete search history.

(56) References Cited

U.S. PATENT DOCUMENTS

| | | | |
|---|---|---|---|
| 9,158,345 B1* | 10/2015 | Rice | G06F 1/184 |
| 2004/0163001 A1 | 8/2004 | Bodas | |
| 2004/0257013 A1 | 12/2004 | Chhleda et al. | |
| 2008/0302505 A1 | 12/2008 | Kato et al. | |
| 2011/0054705 A1* | 3/2011 | Vaidyanathan | G06F 1/206 |
| | | | 700/282 |
| 2012/0026686 A1 | 2/2012 | Suzuki et al. | |
| 2014/0131599 A1* | 5/2014 | Golden | F25B 41/062 |
| | | | 251/129.01 |
| 2015/0378373 A1* | 12/2015 | Sprinkle | G05D 23/1917 |
| | | | 700/276 |
| 2015/0378404 A1 | 12/2015 | Ogawa et al. | |
| 2016/0098020 A1* | 4/2016 | Salsbury | G05B 11/42 |
| | | | 700/32 |

* cited by examiner

*Primary Examiner* — Nathan L Laughlin
(74) *Attorney, Agent, or Firm* — Dergosits & Noah LLP; Todd A. Noah

(57) ABSTRACT

A system and method for controlling cooling in a computing device are provided. A measurement of power consumption of at least one of the computer components is received. A theoretical setting for the cooling system is determined based on the received measurement of power consumption. A current setting of the cooling system is identified. Based on a difference between the theoretical setting and the current setting, a next setting for the cooling system is determined. An output of the cooling system is controlled based on the next setting for the cooling system.

20 Claims, 14 Drawing Sheets

SYSTEM AND METHOD FOR CONTROLLING COMPUTER COOLING USING IDEAL COOLING SYSTEM SETTINGS, ACTUAL COOLING SYSTEM SETTINGS, AND COMPUTER COMPONENT DATA

CROSS-REFERENCE TO RELATED APPLICATIONS

The present application is a continuation-in-part of U.S. application Ser. No. 15/071,547, filed Mar. 16, 2016, which is incorporated by reference in its entirety.

BACKGROUND

While computer components (e.g., CPUs, chipsets, graphics cards, hard disk drives, etc.) are designed to generate as little heat as possible, these components nonetheless produce heat during operation and thus require a cooling system to dissipate the heat produced. Heat mitigation measures are taken to prevent overheating of components, which may lead to temporary or permanent damage to the components. Computer cooling is required to remove the waste heat produced by the components so that temperatures may be maintained within certain operating limits so as to avoid such damage.

Computers are often equipped with active cooling systems that require energy to cool critical components. These cooling systems can include forced-air devices driven by fans or liquid cooling mechanisms driven by pumps. For example, heatsinks attached to the components may be actively cooled by airflow induced by computer fans to reduce a rise in temperature. Furthermore, attention to patterns of airflow can also help prevent the development of hotspots. Conventional cooling systems operate in similar fashion to that of a thermostat, where cooling is activated when temperatures are sensed to be rising beyond a certain threshold level. These cooling systems, however, provide an optimization problem for designers striving to minimize the energy required to cool system components. In optimizing cooling systems, two common goals are in tension. A first goal is to minimize thermal margins, that is, minimize how far the current operating temperature is below the maximum operating temperature of the processor so that minimal energy is consumed to maintain an allowable temperature. And a second goal is to avoid temperature excursions in excess of thermal specification temperatures when the system is subjected to dynamic power loadings. The first goal generally calls for reducing energy used by the cooling system and the second goal generally calls for increasing energy used by the cooling system.

In practice, fans do not always run at constant speed. In fact, most computers have dynamic fan speed control (FSC) algorithms that react to on-board temperature sensors. FSC algorithms can be subject to frequent changes in component power that result in frequent changes in temperature climates, thus exacerbating issues related to cooling of the components. For example, overcooling may occur when fan speeds are too high. While this situation doesn't threaten the performance of the components, overcooling results in wasted power. Overcooling may also produce excessive sound levels from the running fans. In some instances, the vibration from higher fan speeds has the potential to cause performance degradation in storage devices. Undercooling may also occur when fan speeds are too low, resulting in critical components exceeding maximum operating temperature limits. Additionally, time delays may result from current dynamic fan speed control algorithms, since changes in fan speed may be too slow to cool a system subjected to rapid changes in power consumption or ambient temperature. Optimization is further complicated by the fact that component temperatures may increase or decrease more rapidly as thermal design power (TDP) increases. This makes optimization more difficult as designers strive to maintain small thermal margins in order to minimize power consumption and airflow.

With the continual increase in computing power from more advanced processors and associated components come the challenges of effectively managing temperature of computer components. Thus, there exists a need for a control system that can more efficiently and more intelligently handle computer cooling.

DETAILED DESCRIPTION

Figure 1:
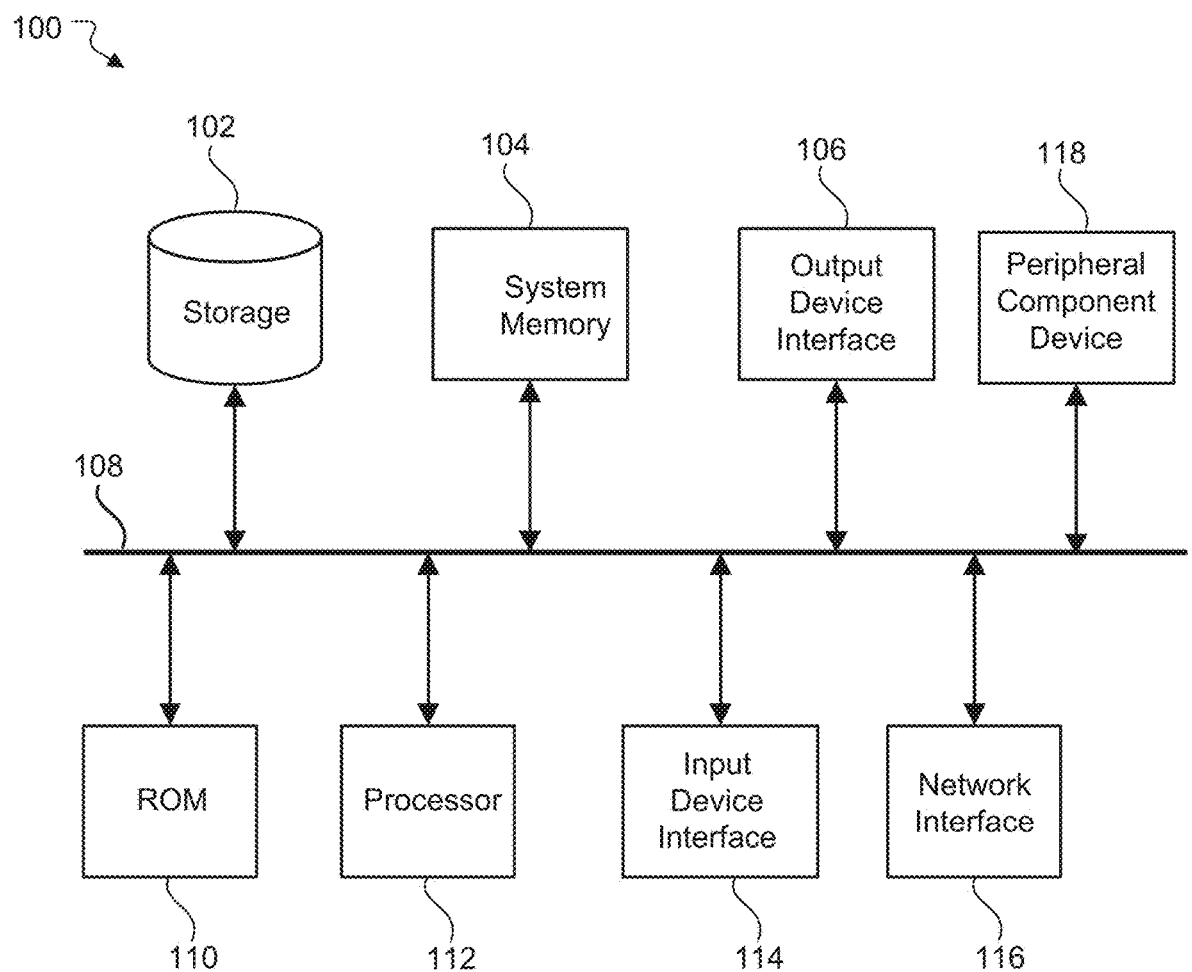
FIG. 1 conceptually illustrates an example electronic system with which some implementations of the subject technology are implemented.

In an embodiment, an algorithm adjusts fan PWM iteratively based on a current fan speed ($PWM_n$) and a theoretical ideal fan speed ($PWM_I$). The resulting increase or decrease in fan PWM may be proportional to the difference between the current fan speed ($PWM_n$) and the theoretical (or "ideal") fan speed ($PWM_I$). The embodiment may avoid PWM over-compensation (in either direction) by iteratively approaching ideal PWM, as opposed to jumping directly to ideal PWM.

Embodiments disclosed within may be used when a CPU is at risk of being throttled due to their operating at an excessive temperature. For this reason, embodiments will generally be called anti-throttle fan speed control (anti-throttle FSC) to differentiate them from other types of control (e.g., R-Value control). However, the use of anti-throttle FSC is not limited to those times when a CPU is at risk of being throttled.

Anti-throttle FSC control may avoid component overheating when that component is subjected to dynamic power loadings, e.g., power spikes. Over-heating may be avoided because, with anti-throttle FSC control, fan speed can increase faster than with traditional relative FSC algorithms until theoretical PWM is achieved. Anti-throttle FSC control may also avoid component over-cooling while subjected to dynamic power loadings because, with anti-throttle FSC control, fan speed may avoid over-shooting $PWM_I$ by approaching ideal $PWM_I$ iteratively. Avoiding overcooling also results in power savings.

In an embodiment, PWM is adjusted based on the difference between theoretical PWM ($PWM_I$) and current PWM ($PWM_n$), Equation 1, below. In Equation 1, the difference between theoretical PWM and current PWM is multiplied by a Delta Coefficient (D). The product is then added to the current PWM to arrive at the next PWM ($PWM_{n+1}$) for the fan for the next time step.

$$PWM_{n+1} = PWM_n + D(PWM_I - PWM_n) \quad \text{Equation 1}$$

n=time step
D=delta coefficient
$PWM_{n+1}$=next PWM
$PWM_n$=current PWM
$PWM_I$ theoretical "ideal" PWM In an embodiment, Delta Coefficient (D) may range from 0.00 to 1.00. For D=0.00 there would be no fan speed change, while for D=1.00 the fan speed change would result in a next PWM ($PWM_{n+1}$) equal to the theoretical PWM ($PWM_I$). In an embodiment, the Delta Coefficient (D) is a constant value and the change in PWM is proportional to the difference between current fan speed and theoretical ideal fan speed. In an embodiment, the Delta Coefficient may be a variable. For example, testing could result in a Delta coefficient D that varies based on CPU power, system fan speed, or other input data. In certain circumstances, Delta coefficient D may even decrease with increasing fan speed.

In an embodiment, for the purposes of cooling a component such as a CPU, current PWM ($PWM_n$) is kept lower than theoretical PWM ($PWM_I$). Theoretical PWM ($PWM_I$) is calculated to target a zero thermal margin and to target zero overheating. Delta Coefficient D is then chosen to generally cause fan speed to increase quick enough but not overshoot theoretical PWM ($PWM_I$), though there may be circumstances where overshooting theoretical PWM ($PWM_1$) becomes necessary.

In an embodiment, Delta Coefficient D may be obtained by testing. In most embodiments, Delta Coefficient D is chosen to cause current PWM to increase toward theoretical PWM fast enough to insure that there is no risk of the relevant component overheating while at the same time not so fast that fan power is wasted due to overcooling.

In an embodiment, Delta Coefficient D could vary based on CPU power, system fan speed, or other factors. For example, Delta Coefficient D could increase with increasing of CPU power. Or, Delta Coefficient D could decrease with increasing of fan speed.

In an embodiment where there is a need to keep a component hot, theoretical PWM ($PWM_I$) could become lower than current PWM ($PWM_n$).

Equation 1 accounts for ambient temperature and component power in the form of theoretical PWM (equations for which are discussed within). In contrast, some existing technologies use feed-back control systems that do not incorporate knowledge of the under-lying physical system.

The subject matter discloses a cooling system for cooling a computing device based in part on measurements of power consumption of computer components. In an embodiment, a measurement of the power consumption of a computer component may be received and a current setting of the cooling system identified. Based in part on that received measurement of power consumption, a theoretical setting for the cooling system may be determined. With the current setting and the theoretical setting, a next setting for the cooling system may be determined based on the theoretical setting and the current setting. The cooling system may then be controlled using the next setting.

Examples of components from which power consumption measurements are received may include but are not limited to the central processing unit (CPU), an in-line memory module (e.g., a dual in-line memory module), a storage drive (e.g., a hard drive), and a peripheral component interconnect express (PCIe) card.

In an embodiment, temperature readings from one or more of the computer components may also be received. Based on the received temperature readings and corresponding maximum operating temperature values associated with the components, thermal margins may be calculated. In some embodiments, the output of the cooling system may further be controlled based on the received temperature readings from the computer components and the calculated thermal margins. For example, in order to minimize the amount of power consumed, the cooling system may be configured to minimize thermal margin values while ensuring that component temperatures do not exceed maximum allowable temperatures during dynamic power loadings. In an embodiment, ambient temperature readings may also be received from one or more zones of the computing device. Ambient temperature readings provide yet another input that the cooling system may use to determine how best to control the output of the cooling system of the computer components.

In some embodiments, the power consumption of the computer components may be determined by one of firmware, an external measurement device, and a mathematical derivation. Likewise, component temperature as well as ambient temperature may be determined by firmware or external measurement devices. Furthermore, while the discussion below relates primarily to forced air cooling systems using fans, the same concepts may be applied to liquid cooling systems using water pumps as well.

Prior to describing the subject matter in detail, an exemplary hardware system in which the subject matter may be implemented is described. Those of ordinary skill in the art will appreciate that the elements illustrated in FIG. 1 may vary depending on the system implemented.

FIG. 1 conceptually illustrates an example electronic system 100 with which some implementations of the subject technology are implemented. Electronic system 100 can be a computer, a server or any other sort of electronic device that includes components that have heat generation properties. Such an electronic system includes various types of computer readable media and interfaces for various other types of computer readable media. Electronic system 100 includes a bus 108, processing unit(s) 112, a system memory 104, a read-only memory (ROM) 110, a permanent storage device 102, an input device interface 114, an output device interface 106, a network interface 116 and peripheral component device(s) 118.

Bus 108 collectively represents all system, peripheral, and chipset buses that communicatively connect the numerous internal devices of electronic system 100. For instance, bus 108 communicatively connects processing unit(s) 112 with ROM 110, system memory 104, permanent storage device 102 and peripheral component device(s) 118. In an embodiment, processing unit(s) 112 may be the central processing unit (CPU), and system memory 104 may be a dual in-line memory module (DIMM). Furthermore, peripheral component device(s) 118 may be connected to bus 108 via a peripheral component interconnect express (PCIe) card (not shown).

From these various memory units, processing unit(s) 112 retrieves instructions to execute the processes of the subject disclosure (i.e., control of the component cooling system). The processing unit(s) can be a single processor or a multi-core processor in different implementations.

ROM 110 stores static data and instructions that are needed by processing unit(s) 112 and other modules of the electronic system. Permanent storage device 102, on the other hand, is a read-and-write memory device. This device is a non-volatile memory unit that stores instructions and data even when electronic system 100 is off. Some implementations of the subject disclosure use a mass-storage device (such as a magnetic, solid state, or optical disk and its corresponding disk drive) as permanent storage device 102.

Other implementations use a removable storage device (such as a floppy disk, flash drive, and its corresponding disk drive) as permanent storage device 102. Like permanent storage device 102, system memory 104 is a read-and-write memory device. However, unlike storage device 102, system memory 104 is a volatile read-and-write memory, such as random access memory. System memory 104 stores some of the instructions and data that the processor needs at runtime. In some implementations, the processes of the subject disclosure are stored in system memory 104, permanent storage device 102, and/or ROM 110. For example, the various memory units include instructions for determining an output of a computer component cooling system. From these various memory units, processing unit(s) 112 retrieves instructions to execute and data to process in order to execute the processes of some implementations.

Bus 108 also connects to input and output device interfaces 114 and 106. Input device interface 114 enables the user to communicate information and select commands to the electronic system. Input devices used with input device interface 114 include, for example, alphanumeric keyboards and pointing devices (also called "cursor control devices"). Output device interface 106 enables, for example, the display of images generated by the electronic system 100. Output devices used with output device interface 106 include, for example, printers and display devices, such as cathode ray tubes (CRT) or liquid crystal displays (LCD). Some implementations include devices such as a touchscreen that functions as both input and output devices.

Finally, as shown in FIG. 1, bus 108 also couples electronic system 100 to a network (not shown) through a network interface 116. In this manner, the computer can be a part of a network of computers, such as a local area network, a wide area network, or an Intranet, or a network of networks, such as the Internet. Any or all components of electronic system 100 can be used in conjunction with the subject disclosure.

Figure 2:
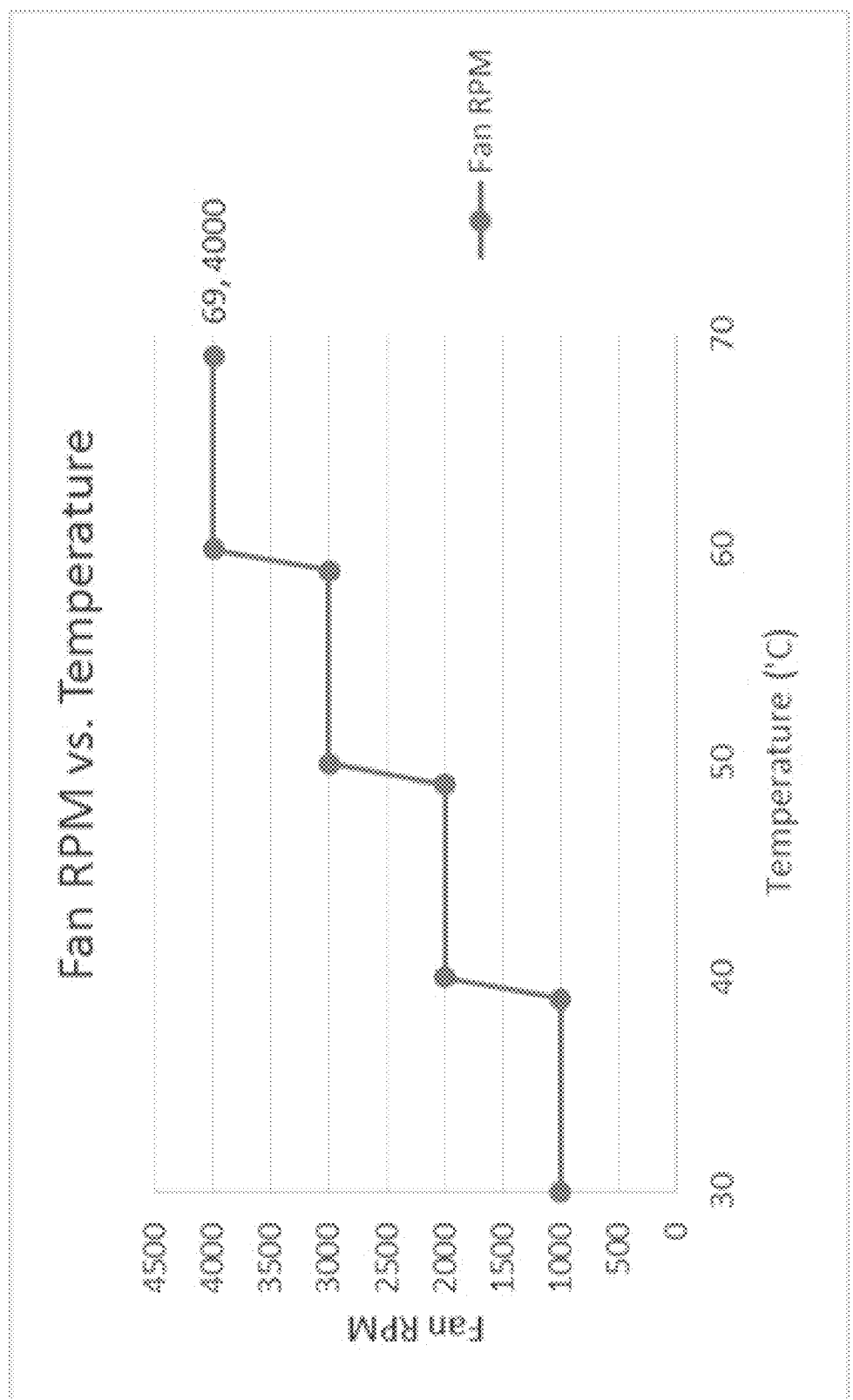
FIG. 2 provides a graph representing a conventional computer cooling control system.

FIG. 2 provides a graph representing a conventional computer cooling control system using fan speed control (FSC). FSC is typically used when CPU power is low. During FSC, conventional computer cooling systems use some combination of component temperature, temperature margin and temperature sensor reading to control fan speed. Fan speed can be determined as fan revolutions per minute (RPM), a percentage of maximum RPM, or PWM. As shown in FIG. 2, temperature rises along the x-axis results in the computer cooling control system stepping up fan RPM to compensate for the heat generated. In this example, when component temperature rises to 40° C., the fan speed is stepped from 1000 RPM to 2000 RPM. Each subsequent 10° C. increase in temperature further steps up fan speed an additional 1000 RPM.

In practice, frequent changes in temperature climates expose certain shortcomings of the conventional computer cooling control system. In some cases, overcooling may occur when there is a temporary spike in temperature, and fan speeds are adjusted to run too high to compensate. This overcooling results in wasted power as well as potentially excessive sound levels generated by the running fans. Running fans at higher speeds for long durations also has potential to cause performance degradation in storage devices as a result of rotational vibration. In other cases, undercooling may also occur when fan speeds are increased too slowly to account for a sharp rise temperatures. Undercooling may result in critical components exceeding maximum operating temperature limits.

Figure 3:
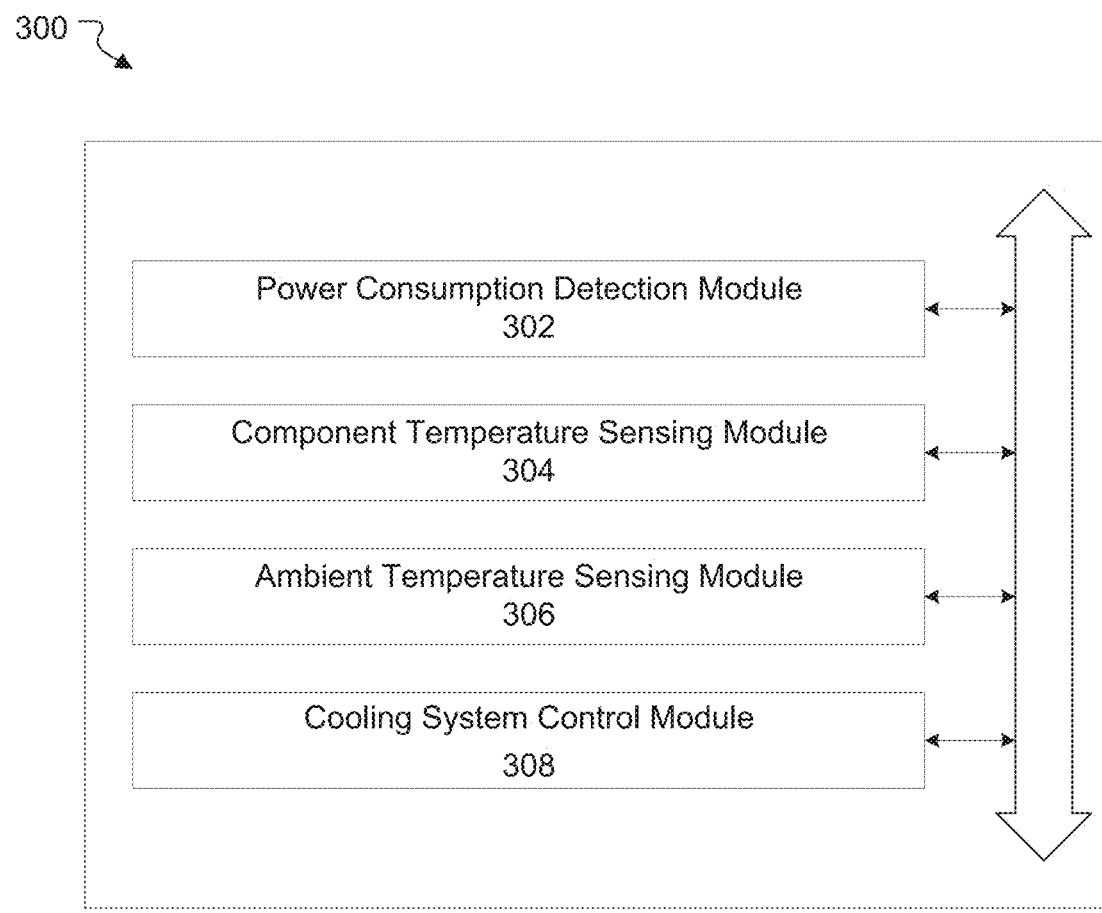
FIG. 3 illustrates an example system for controlling a computer cooling system.

To address such deficiencies, a control system that can more efficiently and more intelligently handle computer cooling may be used. FIG. 3 illustrates an example system for intelligent control of a computer cooling system. System 300 includes a power consumption detection module 302, a component temperature sensing module 304, an ambient temperature sensing module 306, and a cooling system control module 308. These modules, which are in communication with one another, process information retrieved from components connected to bus 108 (such as system memory 104, processing unit(s) 112, and peripheral component device(s) 118) to produce a command for the cooling system. For example, power consumption measurements and component temperature may be received by power consumption detector module 302 and component temperature sensing module 304, respectively, from any or all of the components connected to bus 108. Additionally, ambient temperature readings may be received from a peripheral component device 118 by ambient temperature sensing module 306.

When any of the power consumption measurements, component temperatures and ambient temperatures have been received, cooling system control module 308 processes the received information and sends a signal to control the output of the cooling system of the computer components. For example, if power consumption measurements indicate an increase in power consumption by one or more of the components of the system, cooling system control module 308 may send a signal to increase the output of the cooling system. An increase in output may result in the activation of a cooling fan, or an increase in the fan speed of the cooling fan.

Cooling system control module 308 may adjust the output of the cooling system based on information received from any one of power consumption detection module 302, component temperature sensing module 304, ambient temperature sensing module 306, or a combination of any two or all three modules. Furthermore, the information received from the modules may include measurements taken from any one or more of the components connected to bus 108. As discussed above, the components from which these measurements may be taken include but are not limited to system memory 104, processing unit(s) 112, and peripheral component device(s) 118.

In some aspects, the modules may be implemented in software (e.g., subroutines and code). The software implementation of the modules may operate on web browsers running on electronic system 100. In some aspects, some or all of the modules may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both. Additional features and functions of these modules according to various aspects of the subject technology are further described in the present disclosure.

Figure 4:
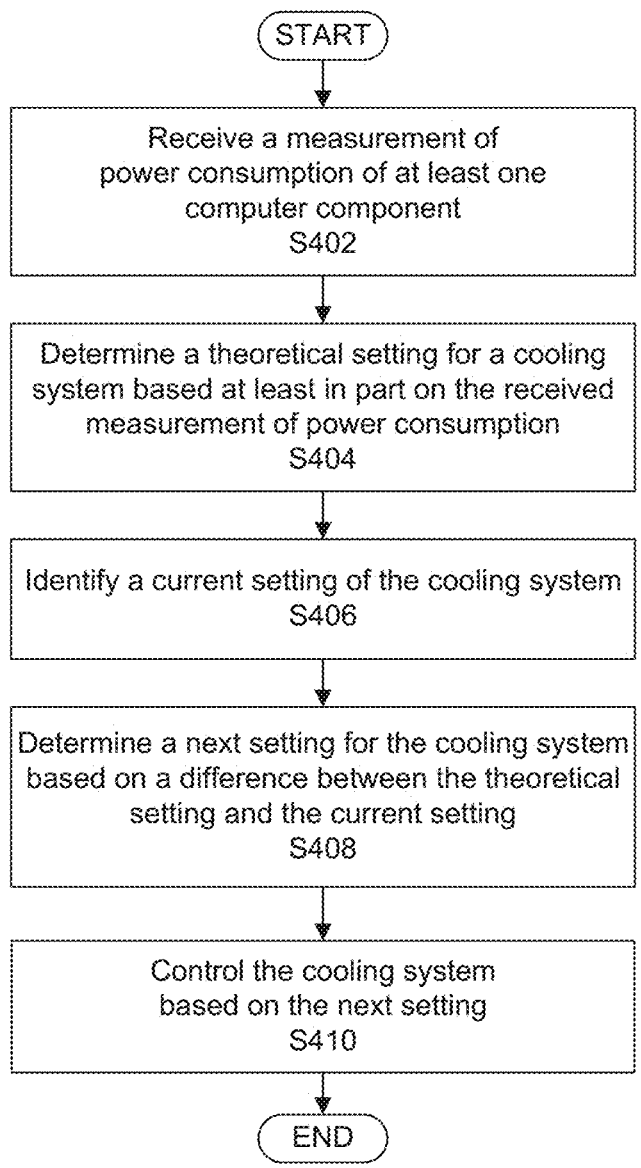
FIG. 4 illustrates an example method for controlling a computer cooling system.

FIG. 4 illustrates example method 400 for controlling a cooling system for cooling components of a computing device. A measurement of power consumption of at least one of the computer components is received in S402. Then in S404, method 400 determines a theoretical setting for a cooling system based at least in part on the received measurement of power consumption. In some embodiments, the theoretical setting may also be based on other considerations such as temperature readings from one or more of the computer components, one or more ambient temperature readings from one or more zones of the computing device, and design temperatures (e.g., maximum and operating temperatures) of one or more components. At S406, a current setting of the cooling system is identified. Then, at S408, a next setting for the cooling system is determined based on a difference between the theoretical setting and the current setting. Subsequently, at S410, the cooling system is controlled based on the next setting determined in S408. Since the system is dynamic in that more or less heat may be generated at any given point in the future, the method is iterative—it is repeated. In an embodiment the method is repeated after a set time period. In an embodiment, the method is repeated based on a different factor, such as a temperature (e.g., a component temperature or an ambient temperature), or a power consumption, or rates of changes of such data.

In an embodiment, the difference in S408 between the theoretical setting and the current setting is multiplied by a coefficient (D) between zero and one ($0 \leq D \leq 1$) and the resulting product added to the current setting to create the next setting. Thus, the coefficient determines what fraction of the difference between the current setting and the theoretical setting is added to the current setting to arrive at the next setting. This coefficient therefore greatly influences whether the next setting is closer to the theoretical setting or to the current setting.

Given the iterative nature of embodiments of the method, the coefficient may be chosen to cause the next setting to approach the theoretical setting at different speed, e.g., rapidly or slowly. A coefficient closer to one (1) would result in the next setting more rapidly approaching the theoretical setting. And a coefficient closer to zero (0) would result in the next setting more slowly approaching the theoretical setting. However, in an embodiment where the coefficient is less than or equal to one (1), the next setting never overshoots the theoretical setting—the next setting approaches the theoretical setting iteratively.

For example, the measured power consumption may indicate that a corresponding amount of heat is expected to be generated and this heat will result in an increase in temperature at one or more of the computer components of the computing device. A theoretical setting for the cooling system may be calculated based in part on this information. But a momentary spike in power consumption may result in an over-estimation of the increase in temperature. If so, a theoretical setting based on that spike may also be an over-estimation of the cooling needed. As a result, controlling the cooling system based on a theoretical setting may result in an overcooling of the component and wasted cooling energy. Method 400 may reduce such overcooling by cooling based on a current setting that does not immediately adopt the theoretical setting. Rather, the current setting takes a step toward the theoretical setting with the size of that step being determined by taking some fraction of the difference between the theoretical setting and the current setting (e.g., S408), where the faction is less than one.

Thus, method 400 provides a quickened response to cooling needs by being based on a theoretical setting (which is itself based on a measurement of power consumption), but also provides a check against overcooling by approaching the theoretical setting iteratively.

In some embodiments, a fan is used by a cooling system to cool system components. The fan generates a forced airflow that may be increased or decreased as needed to increase or decrease its cooling effect. The control for the fan speed can be determined as fan RPM, a percentage of maximum RPM, or PWM, which is a measurement of the power supplied to the fan. In such embodiments, the theoretical setting, current setting, and next setting of method 400 relate to fan speed settings.

Using component power (e.g., power from CPU, DIMM, attached drives, PCIe cards, etc.) to control the fan speed provides an input for determining a theoretical (or "ideal") fan speed for cooling a specified component to a specific target temperature. Component power may be read, measured, or calculated by a variety of methods. In some embodiments, an on-board power measurement is read via firmware. Firmware types include, but are not limited to, Baseboard Management Controllers (BMCs), basic input/output system (BIOS), chassis managers, Statistical Analysis System (SAS) expander firmware, and firmware for a variety of system components (DIMMs, hard disk/solid state drives, CPUs, PCI-e cards, etc.). In other embodiments, component power may be measured by external measurement devices including multi-meters and AC power analyzers. In some instances, component power may be calculated by mathematical derivation. For example, component power consumption may be derived from known component temperatures, environment temperatures and fan PWMs.

An increase in component power typically indicates an increase in processing and/or other functionality demands, and in turn, an increase in the heat generated. Such increases in heat generation typically lag behind measured increases in component power consumption since components tend to heat up gradually as processing demand increases. Thus, having power consumption measurements of computer components allows the computer cooling control system to predict potential increases in component temperature, and adjust theoretical fan speeds instantaneously in order to mitigate situations as soon as they arise, or even before they arise. Addressing heat issues in a timely fashion may also result in lower power requirements to maintain operating temperatures of components below a specified threshold. Table 1, as described in detail below, provides an illustration of the power consumption savings from the use of computer cooling system that bases calculations on component power.

In some embodiments, the output of a cooling system of the computer components may be controlled based additionally on the received temperature readings from one or more of the computer components, and/or the received ambient temperature readings. Component and ambient temperature readings, in addition to component power measurements, may provide additional means to accurately estimate the fan speeds required to cool a specified component to a specific target temperature. Actual component temperatures, along with ambient temperatures of the computing device, provide a snapshot of current temperature conditions. When combined with component power consumption measurements, an accurate estimate of current and impending temperature conditions of the computing device may be made. Utilizing such information, the computer component cooling system may adequately and intelligently address cooling concerns by adjusting fan speeds accordingly.

Figure 5:
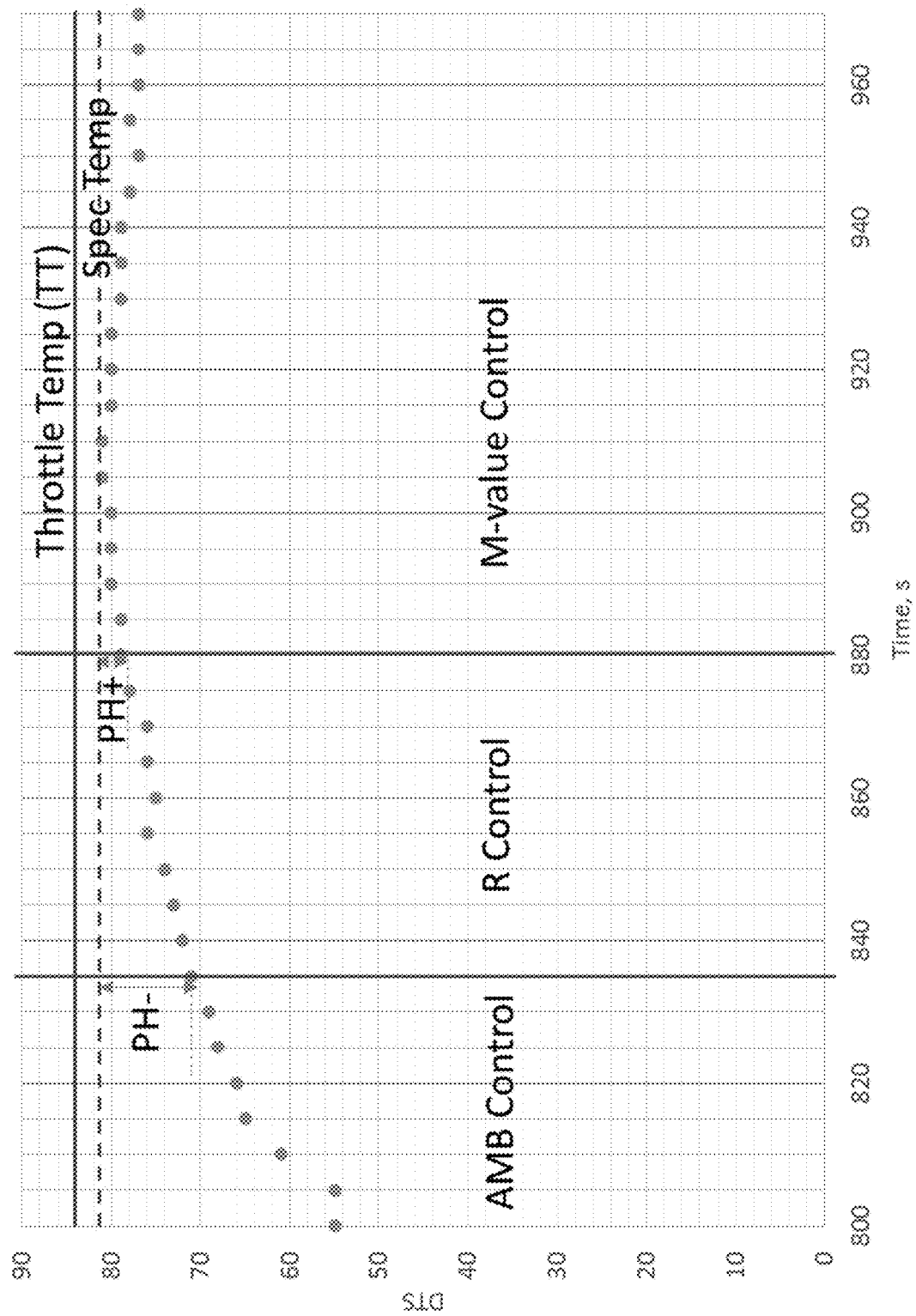
FIG. 5 provides a graph depicting a component temperature and three-phase cooling system operation.

In some embodiments, the computer component cooling system operates in multiple phases. FIG. 5 is a graph depicting a component temperature and three-phase cooling system operation. While the following description provides for an exemplary three-phase operation, other types of operations including additional phases may also be used. In the three-phase operation system, a first phase (also known as the ambient phase (AMB Control)) is characterized by a CPU having operating temperature (represented by disconnected dots) below a predefined low threshold (PH$^-$). In the first phase, CPU power measurements are used to estimate temperature of other downstream components. For example, power to downstream components may be derived from the CPU power consumption measurements. During the first phase, fan speed is determined by the component and ambient temperature.

The three-phase operation enters a second phase (R-Value control (R Control) when the CPU temperature is moderate (e.g., above the predefined low threshold (PH$^-$), but below a predefined high threshold (PH$^+$). Note that PH$^+$ and PH$^-$ are not the hysteresis range values (H$^+$, H$^-$) described with reference to FIG. 10). During this phase, the component power is monitored such that if there is a significant increase, the fan(s) may be quickly activated to address the impending rise in temperature as a result of the increased processing demands. The significance of the increase may be determined via the above-described correlation models. For example, the correlation model may indicate that when an X rise in component power is measured, a Y increase in component temperature is expected. If that Y value is greater than a predefined value and requires heat mitigating efforts, then the increase may be considered significant. During this phase, the fan(s) may be activated in advance of a detected rise in temperature such that the computer component cooling system does not have to play "catch up" with a potential rapid increase in temperature.

By the same logic, a reduction of power consumption, as measured at the component, may suggest an impending reduction in component temperature. Based on this information, the computer component cooling system may reduce the speed of the fan in anticipation of this reduction. Doing so helps conserve energy that would have otherwise been used to cool the component temperature father below the predefined threshold than necessary, thereby causing a suboptimal increase in the thermal margin.

In the third phase of the three-phase operation (M-Value control), the CPU temperature reading is above the predefined high threshold (PH$^+$). During this phase, the CPU temperature is the only input required for controlling the fan speed. When the temperature is above the predefined high threshold (PH$^+$), the computer component cooling system's objective is to reduce the temperature as quickly as possible. In order to do so, the fan speed may be maximized until the CPU temperature falls below the high threshold. If power consumption happens to be low, the fan still needs to operate at max level to reduce temperature readings as quickly as possible. If power consumption is high, there would be no additional measure to be taken, since the fan is already operating at max level. In other words, short of dropping the CPU temperature below the high threshold, it is inconsequential whether measurement of power consumption by the CPU is high/rising or low/falling. In the third phase, the CPU temperature is shown to almost reach the specified maximum operating temperature (Spec Temp) before falling. At all times, the CPU temperature is shown to be below a throttle temperature (TT). If the CPU temperature had reached or exceeded the throttle temperature, the CPU may have had its operating frequency reduced ("throttled") to limit the amount of heat produced by the CPU—a situation that it is desirable to avoid.

In some embodiments, thermal benchmark tests may be used to simulate a variety of boundary conditions for computer components based on these measurements and/or temperature readings. Benchmark test data, in addition to data regression techniques, may be used to determine temperature correlations. For example, mathematical correlations based on component powers may be used to determine the airflow or fan speed required for all possible conditions. This correlation may include mathematical correlations to formulate models for component boundary conditions. Boundary conditions may include such metrics as local ambient temperatures, upstream heat dissipation, and localized airflow. Formulation of boundary conditions correlations can be dependent on airflow characteristics (i.e., fan speed) and/or explicit temperature/power readings from other components.

Mathematical correlations for estimation of component temperature may also be generated. These correlations may be dependent on component power consumption as well as calculated boundary conditions obtained from direct calculation (as described above) or input as an intermediate variable. Mathematical correlations may be used to determine airflow requirements for system components. For example, airflow requirements can be calculated according to operating temperature limits, component boundary conditions (actual or calculated), component temperature (actual or calculated), and component power consumption (actual or calculated). Additionally, airflow requirements for multiple computer components may be determined in parallel. This ensures that all critical component temperature remain below maximum operational temperature limits. FIGS. 6a-6e provide illustrative examples of how mathematical correlations are applied to determine control of the computer component cooling system.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Figure 6A:
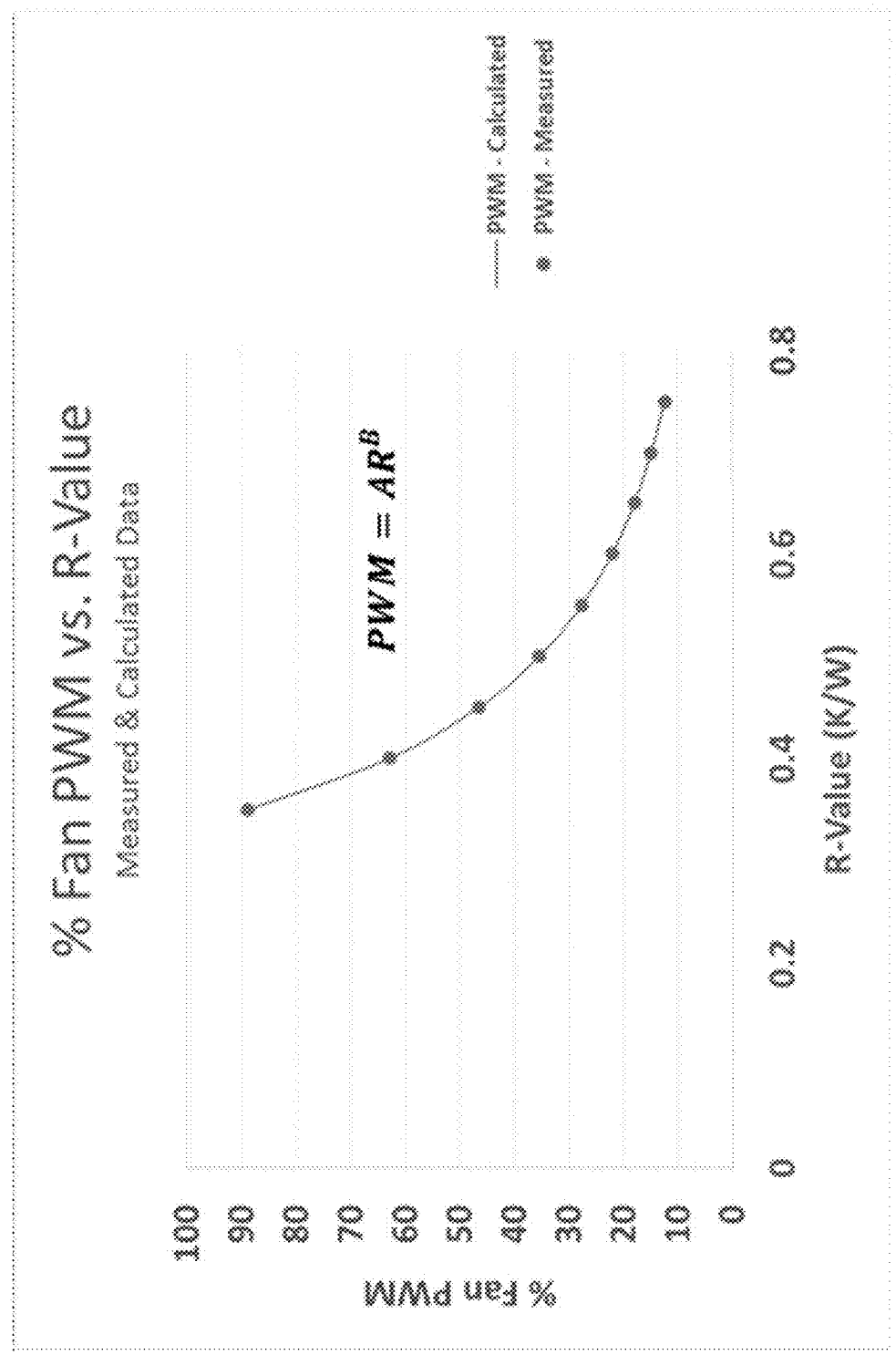
FIG. 6a provides a graph depicting a mathematical correlation between an intermediate variable to a fan pulse width modulation (PWM)

FIG. 6a provides a graph depicting the mathematical correlation between an intermediate variable, which depends on component power and other conditions, to a fan PWM, which indicates the airflow required. While the current example relates to a specific computer cooling control system, those of ordinary skill in the art will appreciate that other mathematical correlations may be used to correspond to alternative computer cooling control systems.

The current example utilizes the correlation function represented by the following equation:

$$PWM = A\left(\frac{T_{targ} - T_{amb}}{Q}\right)^B \qquad \text{Equation 2}$$

Equation 2 is a power equation that estimates the relationship between PWM and R-Value for a specific computer cooling control system. Equation 2 is an equation for a theoretical (or "ideal") setting—a theoretical PWM setting.

While the graph depicted in FIG. 6a (representing Equation 2) indicates a strong correlation for the specific computer cooling control system, Equation 2 may not provide as strong a correlation for other computer cooling control systems. Instead, other computer cooling control systems may require different formulations, which can include polynomial (Equation 3), exponential (Equation 4), and a variety of other curve-fit methods.

$$PWM = A + BR + CR^2 + \qquad \text{Equation 3}$$

$$PWM = Ae^{Bx} \qquad \text{Equation 4}$$

Figure 6B:
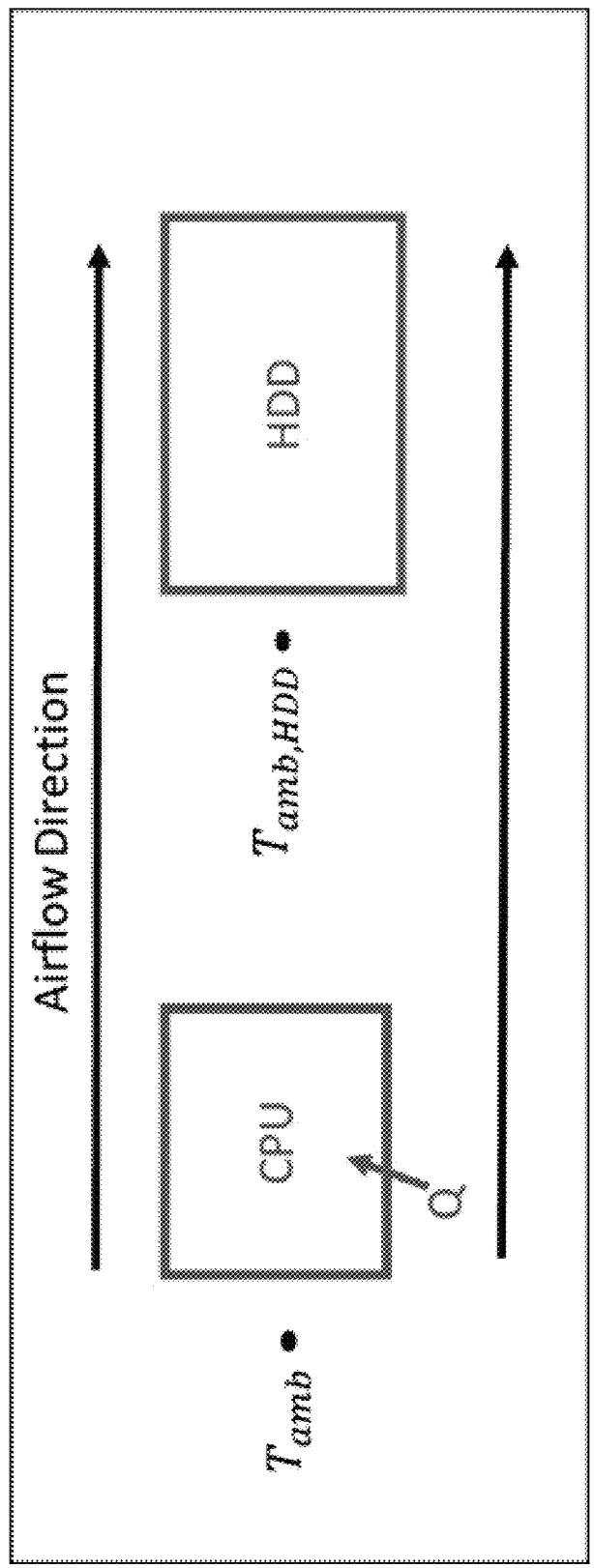
FIG. 6b illustrates a configuration of computer components for which boundary condition estimation for a hard disk drive may be calculated.
Figure 6C:
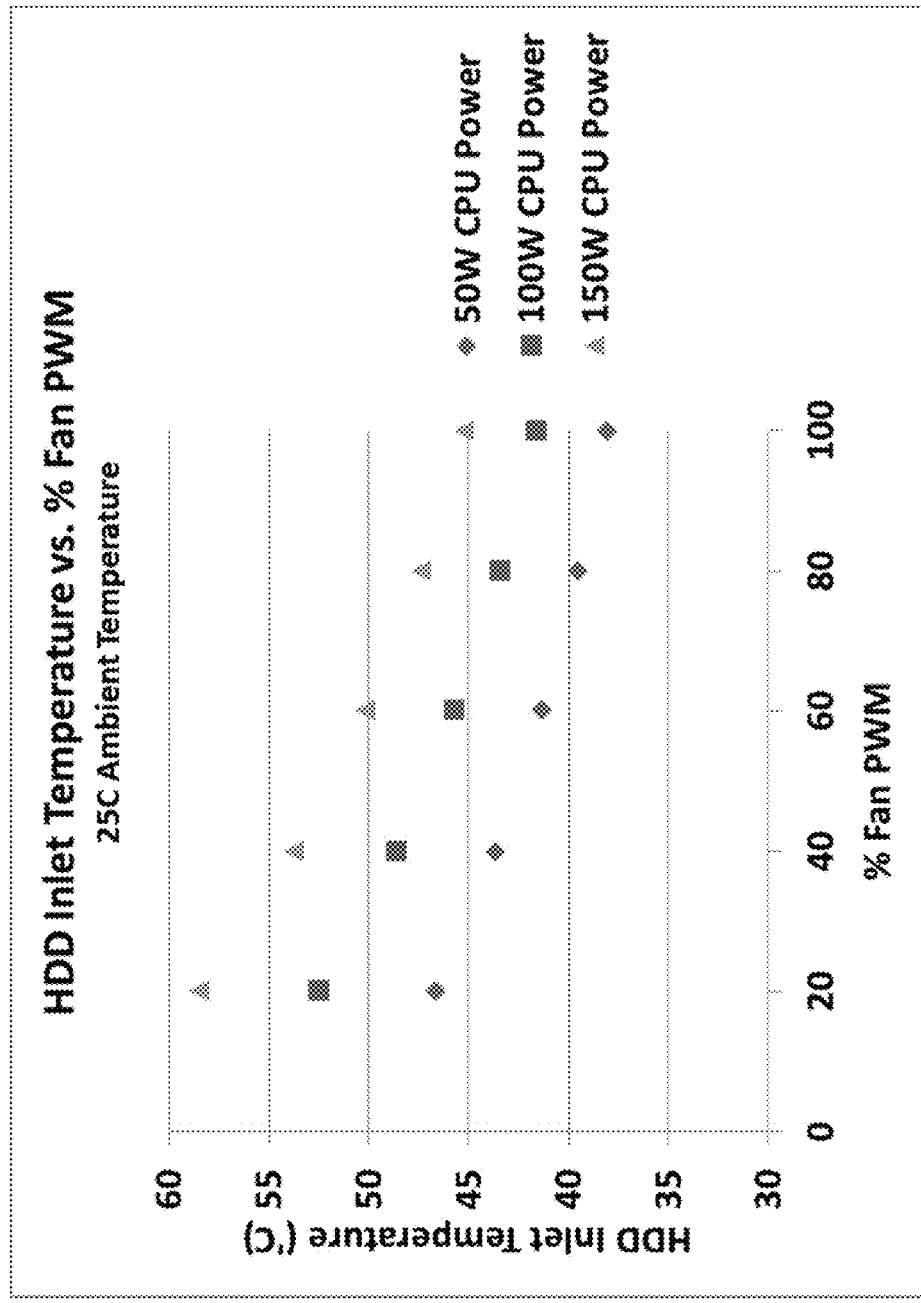
FIGS. 6c and 6d provide graphs illustrating results of benchmark thermal testing.
Figure 6D:
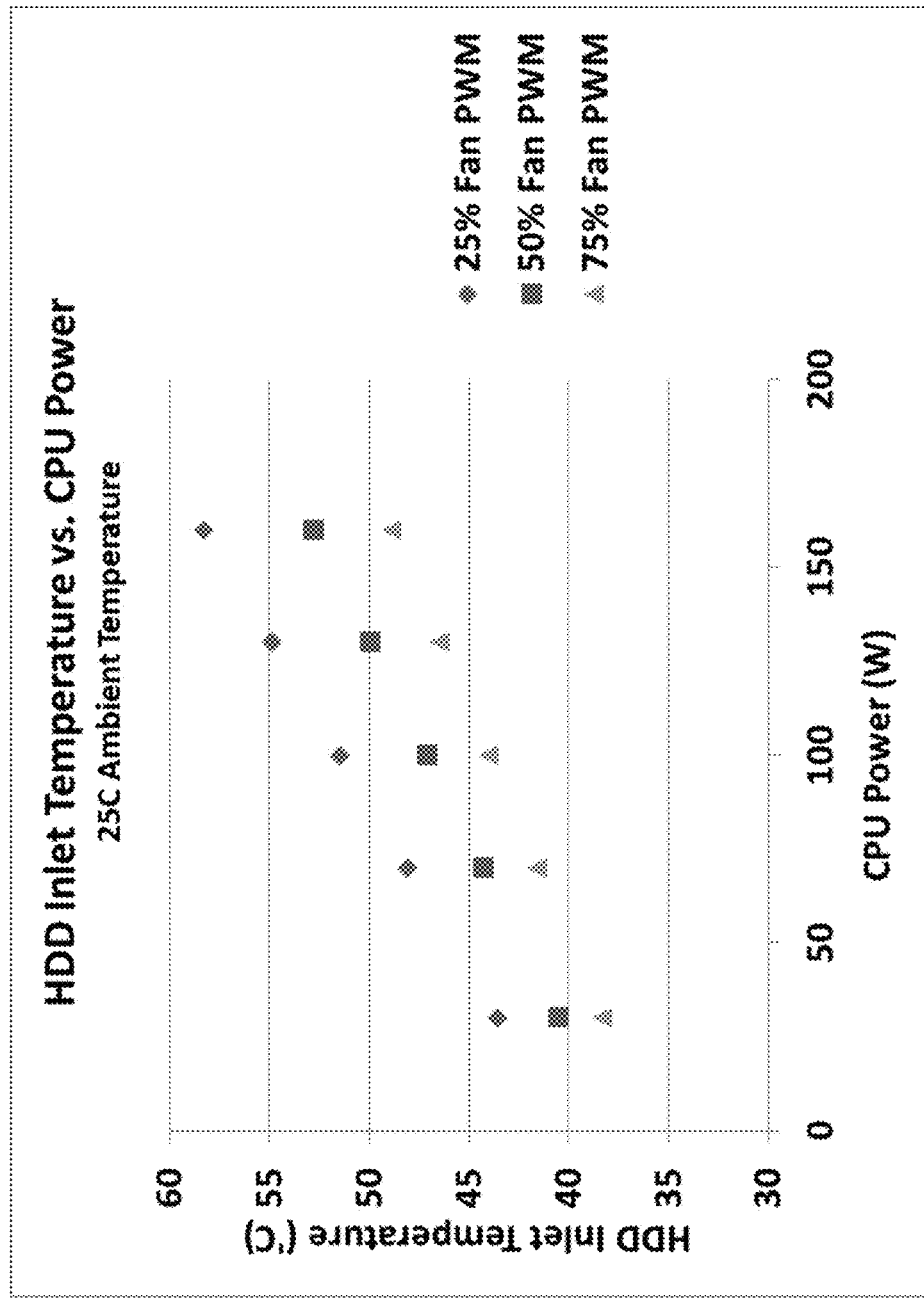

FIG. 6b illustrates a configuration of computer components for which boundary condition estimation (E-value) for a hard disk drive (HDD) may be calculated. In the configuration represented by FIG. 6b, HDD inlet temperature ($T_{amb,HDD}$) is determined in terms of ambient temperature ($T_{amb}$), CPU power (Q), and fan PWM (PWM). FIGS. 6c and 6d provide graphs illustrating results of benchmark thermal testing. The graph indicates that HDD inlet temperature is proportional to CPU power (shown in FIG. 6c), and inversely proportional to % Fan PWM (shown in FIG. 6d). By using linear approximations of the dependence on CPU power and % Fan PWM, Equation 5 may be determined.

$$T_{amb,HDD} = \frac{a + bQ}{PWM + c} + T_{amb} \qquad \text{Equation 5}$$

In Equation 5, values represented by a, b, and c are unknown constants that depend on the underlying computer cooling control system. In other words, a, b, and c may vary depending on factors such as the configuration of computer components. These values may be calculated using thermal benchmark data in conjunction with linear and/or non-linear system solvers.

In addition to estimating HDD inlet temperature, a reverse form of Equation 5 may be used to calculate the PWM required to maintain the HDD inlet temperature at a specific value, shown as Equation 6 below.

$$PWM = \frac{a + bQ}{T_{targ} - T_{amb}} - c \qquad \text{Equation 6}$$

Figure 6E:
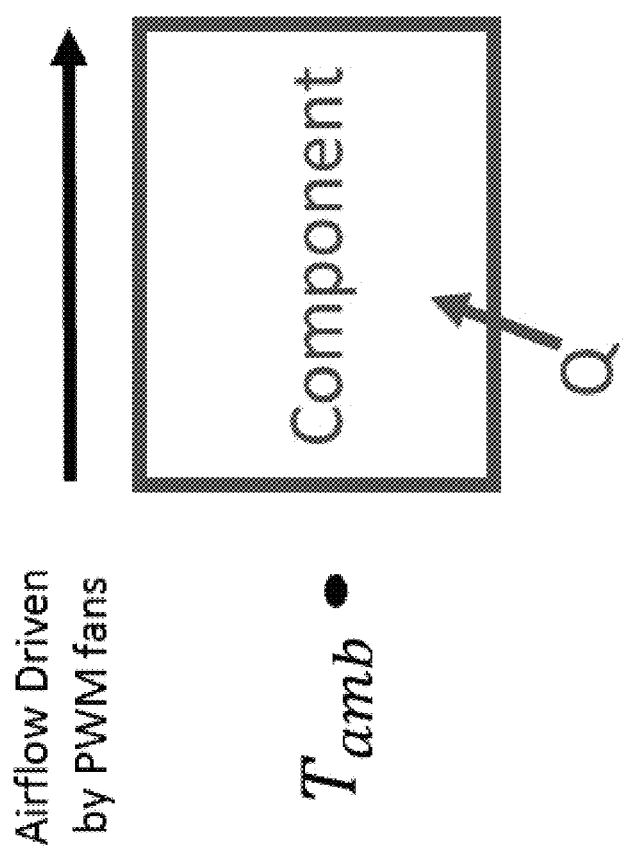
FIG. 6e illustrates a configuration of computer components for which component temperature may be estimated.

FIG. 6e illustrates a configuration of computer components for which component temperature (R-value) may be estimated. In determining the component temperature ($T_{comp}$) with respect to component power (Q), fan PWM (PWM), and ambient temperature ($T_{amb}$), thermal resistance R-value may be introduced as follows.

$$R = \frac{T_{comp} - T_{amb}}{Q} \qquad \text{Equation 7}$$

Using thermal benchmark data, Equation 8, below, provides a correlation of PWM with respect to R-value. Note that A and B are unknown constants that correspond to the underlying physical system.

$$PWM = AR^B \qquad \text{Equation 8}$$

A and B may be calculated using thermal benchmark data in conjunction with linear regression techniques. After determining the values of A and B, Equation 9, below, may be used to calculate the PWM required to cool a component to a pre-defined target temperature ($T_{targ}$).

$$PWM = A\left(\frac{T_{targ} - T_{amb}}{Q}\right)^B \qquad \text{Equation 9}$$

Equations 2, 3, 4, 6, 8, and 9 are equations for theoretical (or "ideal") settings—theoretical PWM settings.

Figure 7:
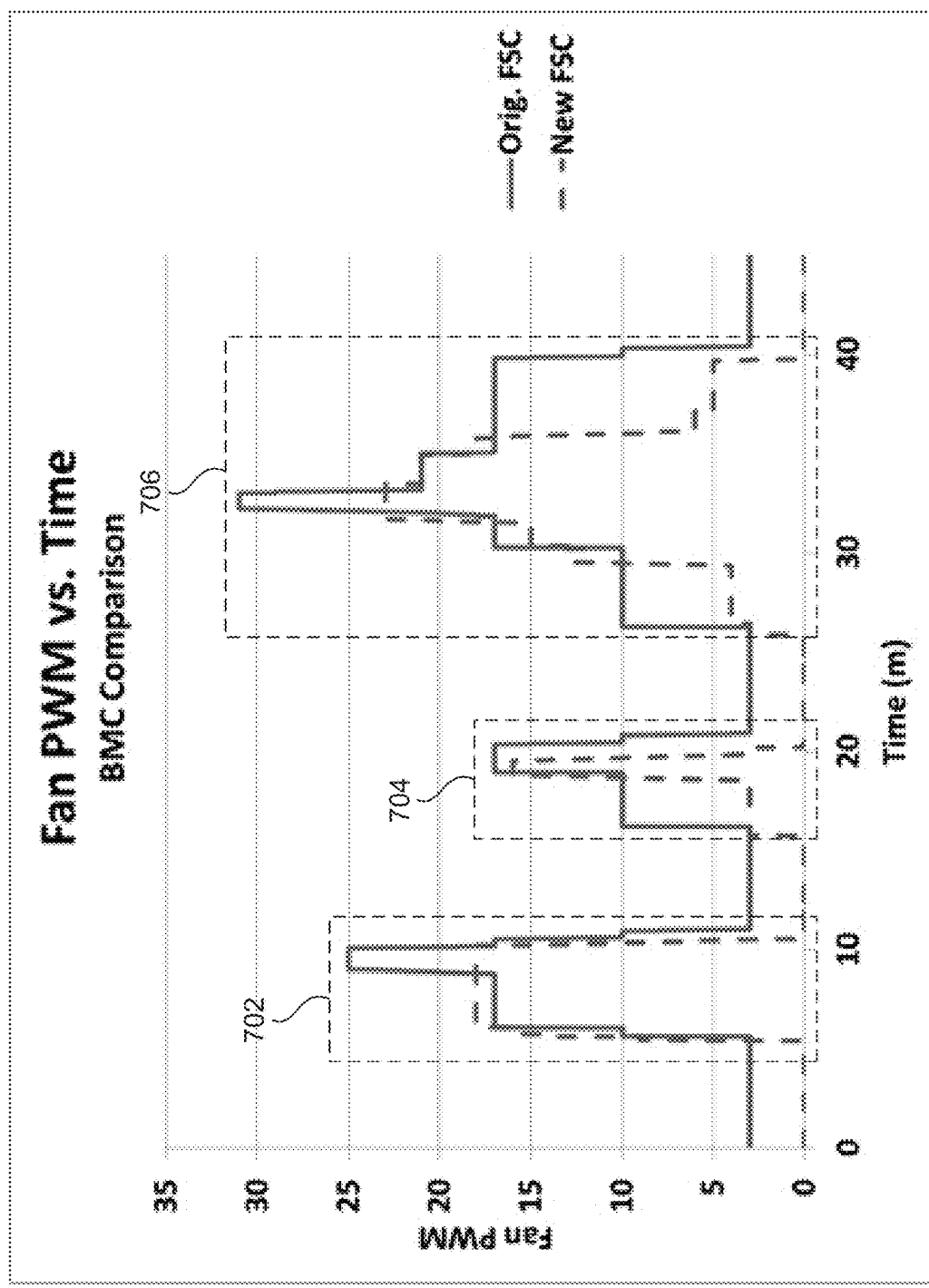
FIG. 7 provides a graph depicting the energy consumption of a conventional computer component cooling system versus that of a computer component cooling system that takes into account component power.

FIG. 7 provides a graph depicting the energy consumption of a conventional computer component cooling system versus that of a computer component cooling system that takes into account component power. By controlling the cooling fan(s) based on component power, significant power savings are realized. In the graph provided by FIG. 7, original FSC power consumption is shown by the solid line and new FSC (i.e., FSC that's determined based on component power) is shown by the dotted line. In short, the power savings is represented by the net area between the original and new FSC lines.

In the graph, three different increases in fan PWM are recorded, each representing a change in temperature event 702, 704 and 706. Each of these three increases represent an increase in fan speed as a result of some predicted (in the case of the new FSC) or actual (in the case of both FSC) temperature increase. As shown, the fan PWM are at a low PWM until about the 5 minute mark along the x-axis where first temperature event 702 occurs. At this time, both fan PWMs increase to a value of approximately 17 in response to an increase in component temperature. At the 8 minute mark, however, the original FSC steps up fan PWM again, to a value of 25, as a result of a continued increase in component temperature. The new FSC, however, maintains a PWM value of 17. The new FSC is able to do so because a measurement in component power indicated a drop in component power consumption, and thus a drop in component temperature was predicted. As a result, the new FSC did not increase fan speed, but instead maintained a constant fan speed. Soon after the 10 minute mark, both the original and new FSCs drop their respective PWM values to the minimum, as the component has been adequately cooled. In this first temperature event 702, a power consumption savings can be observed during the 8 to 10 minute timeframe, where the original FSC raised fan PWM while the new FSC maintained a steady PWM. The resulting cooling effect of the two different approaches, however, was the same.

A second temperature event 704 can be observed at the 15 minute mark. At this interval, both original and new FSC increase fan PWMs at the same time; however, the magnitude of the new FSC is smaller than that of the original FSC, as the new FSC predicts a lesser increase based on component power measurements than what the temperature read by the original FSC indicates. At approximately the 17 minute mark, however, the new FSC receives a component power measurement that suggests that the component temperature is expected to rise. As such, the new FSC steps the fan PWM up to a level approximately equal to that which is being used by the original FSC. The original FSC, however, detects a bump a temperature at the same time and steps up the fan PWM once again, but increases the fan PWM to a level higher than that of the new FSC. At the 20 minute mark, the component temperatures begin to drop and the new FSC again has the additional power consumption information. Thus, the new FSC is able to more quickly reduce fan speeds as the new FSC predicts a sharp drop in temperature based on the power consumption information. The original FSC, on the other hand, can only base fan PWMs on component temperature measured at that time. Thus, the fans are directed to maintain a higher level of PWM than necessary to get the component temperature down to an allowable level. In this second temperature event 704, a power consumption savings can be observed during the 15 to 18 minute timeframe, where the original FSC raised fan PWM more aggressively than the new FSC, and again at the 19 to 20 minute time frame, where the new FSC reduced fan PWM earlier than that of the old FSC.

A third temperature event 706 can be observed starting at the 26 minute mark. At this interval, both original and new FSC increase fan PWMs at the same time. Again, the magnitude of the new FSC is smaller than that of the original FSC, as the new FSC predicts a lesser increase based on component power measurements than what the temperature read by the original FSC indicates. At approximately the 30 minute mark, however, the new FSC receives a component power measurement that suggests that the component temperature is expected to rise. As such, the new FSC steps the fan PWM up to a level higher than that which is being used by the original FSC. The original FSC, however, detects a bump a temperature shortly thereafter and steps up the fan PWM once again, but has to increase the fan PWM to a level higher than that of the new FSC in order to catch up with cooling the component temperature. At the 31 minute mark, the original FSC, in response to further increases in component temperature, makes another significant step up in fan PWM. The new FSC, however, increases fan PWM by a lesser amount since the new FSC again has the component power consumption measurements to estimate component temperature, and this estimate is lower than that which was measured by the original FSC.

Once the component temperatures begin to drop, the new FSC again has the additional power consumption information, and thus is able to more aggressively reduce fan speeds as the new FSC predicts a sharp drop in temperature based on the power consumption information. The original FSC, on the other hand, can only base fan PWMs on component temperature measured at that time. Thus, the fans are directed to maintain a higher level of PWM than necessary to get the component temperature down to an allowable level. In this third temperature event 706, a power consumption savings can be observed during the 26 to 30 minute timeframe, where again the original FSC raised fan PWM more aggressively than the new FSC. At the 36 to 40 minute time frame, the new FSC reduces power consumption by reducing fan PWM earlier and more aggressively than that of the old FSC.

The cumulative effect of being able to more efficiently cool the computer components is represented in Table 1 below.

TABLE 1

| % CPU Usage | | 0% | 50% | 100% | Total |
|---|---|---|---|---|---|
| Fan Power | Original | 21.1 | 24.3 | 33.6 | 26.3 |
| | New | 12.5 | 16.3 | 24.9 | 16.5 |
| % Power Saved | | 40.8% | 32.9% | 25.9% | 37.2% |

As shown, the new FSC controls the fan PWM to use less power across the range of CPU usage. In total, an estimated 37.2% of power is saved by utilizing component power as a metric for determining fan speeds of a computer component cooling control system. The power savings in Table 1 provide a numerical representation of the power consumption savings indicated by the area between the original FSC and the new FSC fan PWM line shown in FIG. 6.

Figure 8:
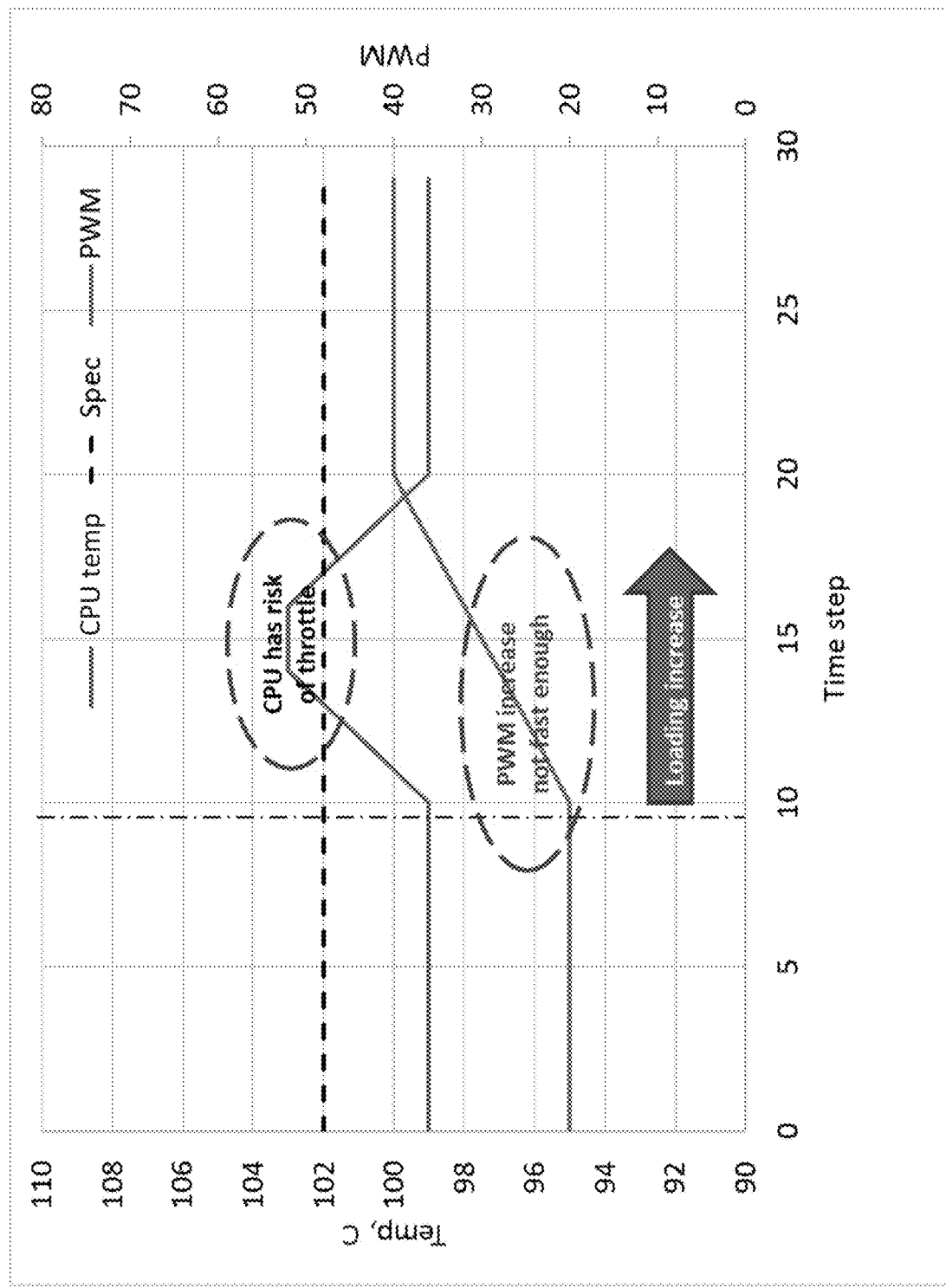
FIG. 8 provides a graph depicting a CPU temperature response with a conventional computer cooling system.

FIG. 8 provides a graph depicting a CPU temperature response with a conventional computer cooling system. FIG. 8, to the right of the vertical dotted line, depicts control using a margin value control (M-Value) where the margin is determined by a difference between the actual component temperature (CPU temp) and a specified maximum temperature (Spec) for that component, in this example a CPU. Here the margin is close to zero. M-Value control was also discussed with reference to FIG. 5, where M-Value control began when the CPU temperature came within PH+ of the specified maximum temperature. With M-Value control, when the component is determined to be elevated past a threshold, the fan speed (PWM) is adjusted according to changes in the component temperature with respect to the constant, specified maximum temperature for that component.

FIG. 8 shows the CPU temperature beginning at 99° C. and, just before time step 10, CPU loading is increased, causing CPU temperature to rise quickly. In response, during M-Value control, the PWM is increased from an initial value of 20%. But either the PWM is not increased quickly enough, or the fan does not respond quickly enough (this last condition would not be shown by this figure). As a result, the CPU temperature exceeds the specified maximum temperature near time step 14. Though the CPU temperature increase is subsequently halted, the CPU temperature remains above the specified maximum temperature until approximately time step 17. The CPU temperature continues to decrease to an eventual steady-state of 99° C. while the PWM is further increased to an eventual PWM steady-state value of 40%. FIG. 8 also shows that the CPU risks being throttled (having its operating frequency decreased) due to the CPU temperature exceeding the specified temperature by approximately 1° C. For example, in FIG. 5 the throttle temperature was approximately 2° C. above the specified temperature.

As illustrated, with M-Value control the PWM increase may not be fast enough to prevent the component from overheating. And, with M-Value control, if the PWM is simply boosted to 100% when the CPU margin nears zero, oscillation and overcooling due to over-extended fan use is still possible. In other words, M-Value control may not be able to match the dynamic loading of the CPU. Thus, FIG. 8 illustrates that in some cases, both 2 and 3-phase FSC may not respond quickly enough to CPU load increases, and may not respond quickly enough to subsequent CPU load decreases (these may be called "corner" cases). Also, if the second phase control discussed with reference to FIGS. 5 and 6a (R-value control) were used after time step 10 (instead of M-Value control), R-value control may cause overcooling and fan speed oscillation because R-value control does not necessarily provide the exact PWM needed. Additionally, if the first phase control discussed with reference to FIG. 2 and FIG. 5 (ambient FSC control) were used after time step 10 (instead of M-Value control), ambient FSC control may cause fan oscillation as well because it is difficult to determine the exact changes in PWM to use (both PWM increases and PWM decreases). That is, it may be that none of the control schemes from 2 or 3-phase FSC respond satisfactorily to spikes in CPU loading.

Figure 9:
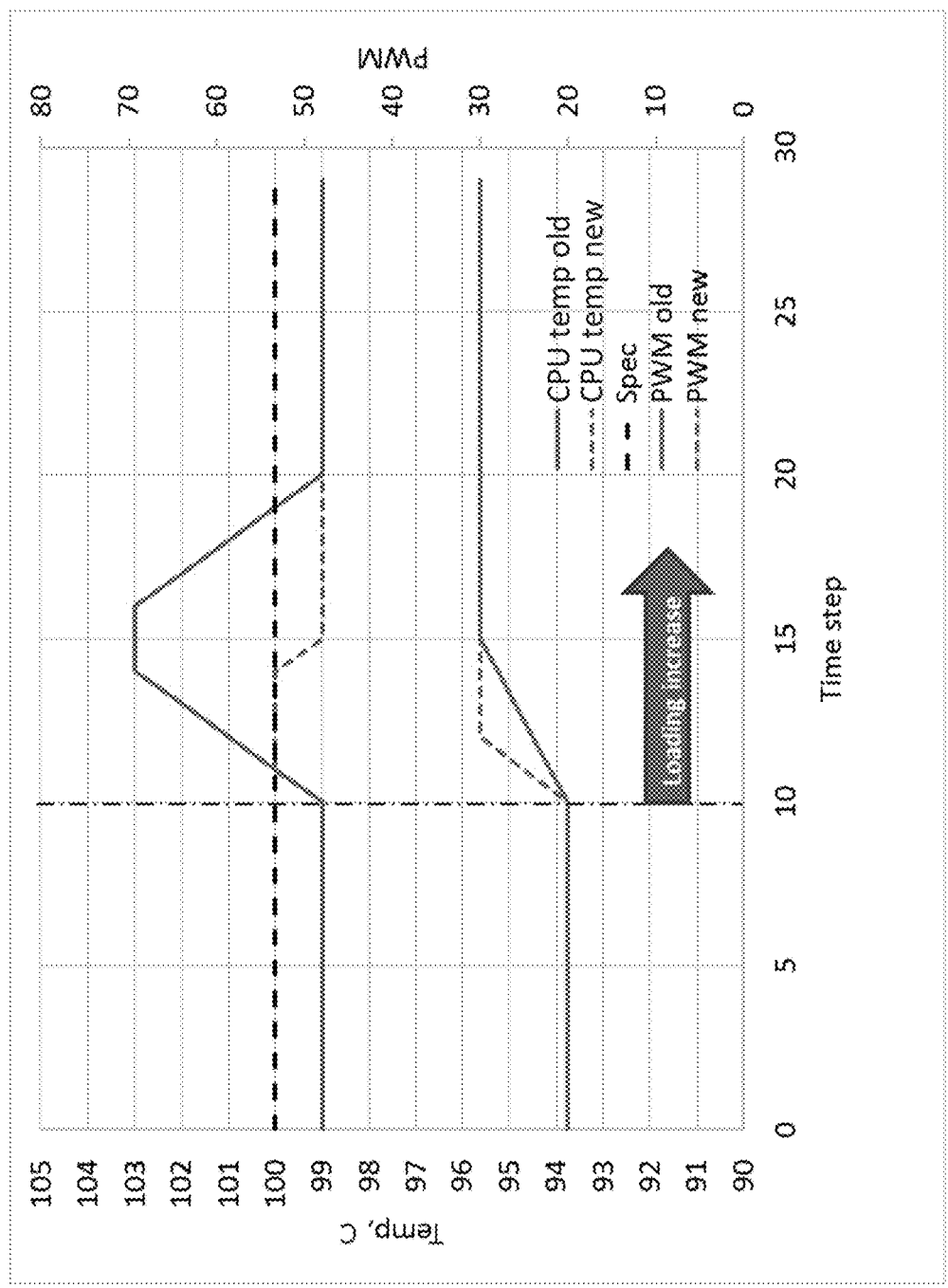
FIG. 9 provides a graph depicting a CPU temperature response with a conventional computer cooling system compared to a CPU temperature response with a cooling system controlled according to an embodiment.

FIG. 9 provides a graph depicting a CPU temperature response with a conventional computer cooling system (solid lines) compared to a CPU temperature response with a cooling system controlled according to an embodiment (dotted lines). FIG. 9 shows the CPU temperature beginning at 94° C. and, at time step 10, CPU loading is increased, causing CPU temperature to rise quickly. In response, during M-Value control (shown using solid lines), the PWM is increased from an initial value of 20%. But either the PWM is not increased quickly enough, or the fan does not respond quickly enough (this last condition would not be shown by this figure). As a result, the CPU temperature exceeds the specified maximum temperature near time step 11. Though the CPU temperature increase is subsequently halted, the CPU temperature remains above the specified maximum temperature until approximately time step 19. The CPU temperature continues to decrease to return to an eventual steady-state of 99° C. while the PWM is further increased to an eventual PWM steady-state value of 30%. FIG. 9 also shows that during M-Value control the CPU risked being throttled (having its operating frequency decreased) due to the CPU temperature exceeding the specified temperature by approximately 3° C. For example, in FIG. 5 the throttle temperature was approximately 2° C. above the specified temperature.

In contrast, dotted lines show the CPU temperature that results from anti-throttle FSC control (CPU temp new, dotted line) and the PWM value determined by anti-throttle FSC control (PWM new, dotted line) laid over the M-Value control data. In the embodiment of anti-throttle FSC, an algorithm adjusts fan PWM iteratively according to current fan speed and a theoretical ideal fan speed. The resulting increase or decrease in fan PWM is proportional to the difference between a current fan speed ($PWM_n$) and a theoretical (or "ideal") fan speed ($PWM_I$). Examples of theoretical fan speeds were discussed previously with reference to Equations 2, 3, 4, 6, 8, and 9. Variables in these may include ambient temperature and CPU power.

In an embodiment, anti-throttle FSC control is used while there is a risk the CPU might be throttled due to excessive temperature.

Anti-throttle FSC control algorithm may avoid component over-heating while subjected to dynamic power loadings, e.g., power spikes, because with anti-throttle FSC control, fan speed can increase faster than traditional relative FSC algorithms until $PWM_I$ is achieved. Anti-throttle FSC control algorithm may also avoid component over-cooling while subjected to dynamic power loadings because with anti-throttle FSC control fan speed may avoid over-shooting $PWM_I$ by approaching ideal $PWM_I$ iteratively. This also results in power savings.

Figure 10:
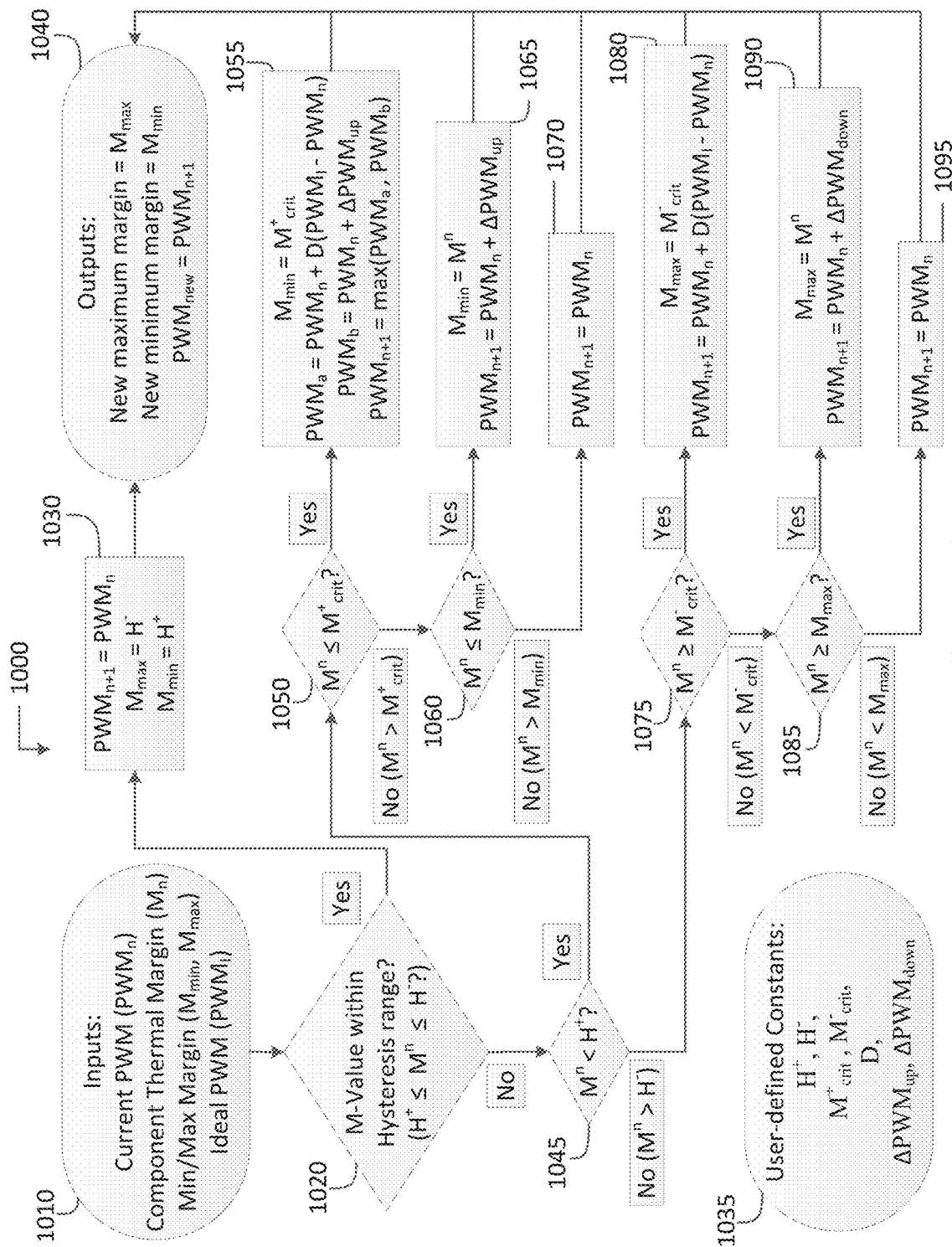
FIG. 10 illustrates an embodiment of a method for controlling a computer component cooling system.

In an embodiment, PWM is adjusted based on the difference between theoretical. PWM ($PWM_I$) and current PWM ($PWM_n$), Equation 1, re-produced below. In Equation 1, the difference between theoretical PWM and current PWM is multiplied by a Delta Coefficient (D). The product is then added to the current PWM to arrive at the next PWM ($PWM_{n+1}$) for the fan for the next time step.

$$PWM_{n+1} = PWM_n + D(PWM_I - PWM_n) \quad \text{Equation 1}$$

n=time step
D=delta coefficient
$PWM_{n+1}$=next PWM
$PWM_n$=current PWM
$PWM_I$=ideal PWM In the embodiment, theoretical. PWM is calculated at each time step, and as discussed above may be an over-estimate or under-estimate when the system is subjected to component power spikes. Anti-throttle FSC control may avoid PWM over-compensation (in either direction) by iteratively approaching ideal PWM, as opposed to jumping directly to ideal PWM FIG. 10 is a flow chart of an embodiment of a method 1000 for controlling a computer component cooling system. FIG. 10 depicts the flow paths for one time period or iteration in the control of a computer component cooling system employing a cooling fan. In method 1000, the cooling fan is controlled by changing the PWM setting for the fan. In FIG. 10, in step 1010, inputs conditions are received. The input conditions include a current PWM setting ($PWM_n$), a component thermal margin (M"), a minimum thermal margin ($M_{min}$), a maximum thermal margin ($M_{max}$), and a calculated theoretical (or "ideal") PWM ($PWM_I$) based on current conditions. Component thermal margin (M") is based on a measured temperature of a component being cooled. Minimum and maximum thermal margins ($M_{min}$, $M_{max}$) are variables that are set by method

1000 and used by the method in certain steps to indicate whether the component thermal margin (Mn) has increased or decreased since the last iteration.

In step 1035, user-defined constants for method 1000 may be chosen by a user. User-defined constants include: a lower margin hysteresis bound ($H^+$), an upper margin hysteresis bound ($H^-$), a lower critical margin ($M^+_{crit}$), an upper critical margin ($M^-_{crit}$), a delta coefficient (D), a PWM increment ($\Delta PWM_{up}$), and a PWM decrement ($\Delta PWM_{down}$).

Lower and upper margin hysteresis bounds ($H^+$, $H^-$) define a preferred operating range for component thermal margin ($M^n$). Lower critical margin ($M^+_{crit}$) defines a value that if not exceeded by component thermal margin ($M^n$) indicates an undesired potential for overheating or throttling of the component being cooled. Upper critical margin ($M^-_{crit}$) defines a value that if exceeded by component thermal margin ($M^n$) indicates an undesired potential for overcooling and excessive use of cooling energy.

In step 1020, component thermal margin ($M_n$) is compared to lower margin hysteresis bound ($H^+$) and upper margin hysteresis bound ($H^-$). If component thermal margin ($M_n$) is between or equal to lower and upper margin hysteresis bounds ($H^+$, $H^-$), then in step 1030: a next PWM setting ($PWM_{n+1}$) is given the value of current PWM setting ($PWM_n$); maximum thermal margin ($M_{max}$) is given the value of upper margin hysteresis bound ($H^-$); and minimum thermal margin ($M_{min}$) is given the value of lower margin hysteresis bound ($H^+$).

Subsequently, in step 1040, outputs for this cycle or iteration include: the new maximum thermal margin ($M_{max}$); the new minimum thermal margin ($M_{min}$); and a new PWM setting ($PWM_{new}$) for the fan of the controlled computer component cooling system. New PWM setting ($PWM_{new}$) is then the PWM setting for the fan during the next interval. At the end of the interval, method 1000 returns to step 1010 and follows the flow chart anew, but with outputs from the previous cycle being used as the values of the corresponding inputs in the new iteration. That is, maximum thermal margin ($M_{max}$) gets the previous output new maximum thermal margin ($M_{max}$), minimum thermal margin ($M_{min}$) gets the previous output new minimum thermal margin ($M_{min}$), and current PWM ($PWM_n$) gets the previous new PWM setting ($PWM_{new}$).

Returning to step 1020, if component thermal margin ($M_n$) is not between or equal to lower and upper margin hysteresis bounds ($H^+$, $H^-$), then in step 1045, component thermal margin ($M_n$) is compared to lower margin hysteresis bound ($H^+$). If component thermal margin ($M_n$) is less than lower margin hysteresis bound ($H^+$), then in step 1050, component thermal margin ($M_n$) is compared to a critical lower margin ($M^+_{crit}$). If component thermal margin (MO is less than or equal to critical lower margin ($M^+_{crit}$), then in step 1055, minimum thermal margin ($M_{min}$) is given the value of critical lower margin ($M^+_{crit}$). Also in step 1055, next PWM setting ($PWM_{n+1}$) is increased as follows. A difference-based PWM ($PWM_a$) is calculated and an increased PWM ($PWM_b$) is calculated. Next PWM setting ($PWM_{n+1}$) is given the greater of the two values: difference-based PWM ($PWM_a$) or increased PWM ($PWM_b$). Difference-based PWM ($PWM_a$) is calculated by taking the difference between theoretical PWM ($PWM_t$) and current PWM ($PWM_n$), multiplying that difference by the Delta coefficient (D), and adding the product to current PWM ($PWM_n$). This calculation increases next PWM setting ($PWM_{n+1}$) because at step 1055 theoretical PWM ($PWM_t$) is greater than current PWM ($PWM_n$). Increased PWM ($PWM_b$) is calculated by adding the current PWM ($PWM_n$) to the PWM increment ($\Delta PWM_{up}$) user-defined constant. Subsequently, in step 1040, outputs for this cycle or iteration include: the new minimum thermal margin ($M_{min}$); and a new PWM setting ($PWM_{new}$) for the fan of the controlled computer component cooling system. The maximum thermal margin ($M_{max}$) was unchanged by this flow path of method 1000.

Returning to step 1050, if component thermal margin ($M_n$) is greater than critical lower margin ($M^+_{crit}$), then in step 1060, component thermal margin ($M_n$) is compared to minimum thermal margin ($M_{min}$). If component thermal margin ($M_n$) is less than or equal to minimum thermal margin ($M_{min}$), then in step 1065, minimum thermal margin ($M_{min}$) is given the value of component thermal margin ($M_n$). Also in step 1065, next PWM setting ($PWM_{n+1}$) is increased as follows. Next PWM setting ($PWM_{n+1}$) is calculated by adding the current PWM ($PWM_n$) to the PWM increment ($\Delta PWM_{up}$) user-defined constant. Subsequently, in step 1040, outputs for this cycle or iteration include: the new minimum thermal margin ($M_{min}$); and a new PWM setting ($PWM_{new}$) for the fan of the controlled computer component cooling system. The maximum thermal margin ($M_{max}$) was unchanged by this flow path of method 1000.

Returning to step 1060, if component thermal margin ($M_n$) is greater than minimum thermal margin ($M_{min}$), then in step 1070, next PWM setting ($PWM_{n+1}$) is given the value of current PWM ($PWM_n$). Subsequently, in step 1040, outputs for this cycle or iteration are unchanged from the inputs.

Returning to step 1045, if component thermal margin ($M_n$) is greater than upper margin hysteresis bound ($H^-$), then in step 1075, component thermal margin ($M_n$) is compared to critical upper margin ($M^-_{crit}$). If component thermal margin ($M_n$) is greater than or equal to critical upper margin ($M^-_{crit}$), then in step 1080, maximum thermal margin ($M_{max}$) is given the value of critical upper margin ($M^-_{crit}$). Also, in step 1080, next PWM setting ($PWM_{n+1}$) is decreased as follows. Next PWM setting ($PWM_{n+1}$) is calculated by taking the difference between theoretical PWM ($PWM_t$) and current PWM ($PWM_n$), multiplying that difference by the Delta coefficient (D), and adding the product to current PWM ($PWM_n$). This calculation decreases next PWM setting ($PWM_{n+1}$) because at step 1080 theoretical PWM ($PWM_t$) is less than current PWM ($PWM_n$). Subsequently, in step 1040, outputs for this cycle or iteration include: the new maximum thermal margin ($M_{max}$); and a new PWM setting ($PWM_{new}$) for the fan of the controlled computer component cooling system. The minimum thermal margin ($M_{min}$) was unchanged by this flow path of method 1000.

Returning to step 1075, if component thermal margin ($M_n$) is less than critical upper margin ($M^-_{crit}$), then in step 1085, component thermal margin ($M^n$) is compared to maximum thermal margin ($M_{max}$). If component thermal margin ($M^n$) is greater than or equal to maximum thermal margin ($M_{max}$), then in step 1090, maximum thermal margin ($M_{max}$) is given the value of component thermal margin ($M_n$). Also, in step 1090, next PWM setting ($PWM_{n+1}$) is decreased as follows. Next PWM setting ($PWM_{n+1}$) is calculated by adding the current PWM ($PWM_n$) to the PWM decrement ($\Delta PWM_{down}$) user-defined constant. Subsequently, in step 1040, outputs for this cycle or iteration include: the new maximum thermal margin ($M_{max}$); and a new PWM setting ($PWM_{new}$) for the fan of the controlled computer component cooling system. The minimum thermal margin ($M_{min}$) was unchanged by this flow path of method 1000.

Returning to step 1085, if component thermal margin ($M''$) is less than maximum thermal margin ($M_{max}$), then in step 1095, next PWM setting ($PWM_{n+1}$) is given the value of current PWM ($PWM_n$). Subsequently, in step 1040, outputs for this cycle or iteration are unchanged from the inputs.

Generally, in method 1000, the input conditions from step 1010 are tested in steps 1020, 1045, 1050, 1060, 1075, and 1085. Depending on the results of those tests, the minimum and maximum thermal margins ($M_{min}$, $M_{max}$) are modified and a new PWM setting ($PWM_{new}$) is determined according to steps 1030, 1055, 1065, 1070, 1080, 1090, and 1095. The new PWM setting ($PWM_{new}$) is then used to control the fan for one time period or iteration. In addition, steps 1055 and 1065 generally increase the new PWM setting ($PWM_{new}$), and steps 1080 and 1090 generally decrease the new PWM setting ($PWM_{new}$) over the current PWM ($PWM_n$). Steps 1070 and 1095 do not change the new PWM setting ($PWM_{new}$) from the current PWM setting ($PWM_n$).

In an embodiment, delta coefficient (D) may be a variable based, for example, one or more of a component temperature, a component power consumption, or a thermal margin. Furthermore, one or more of the calculations in the various steps may be optional. For example, in step 1055, next PWM ($PWM_{n+1}$) may be based on difference-based PWM ($PWM_a$) or on increased PWM ($PWM_b$). That is, in an embodiment, only one of difference-based PWM ($PWM_a$) or increased PWM ($PWM_b$) may be calculated.

Step 1055 is an example of where anti-throttle FSC control may avoid component over-heating while subjected to dynamic power loadings, e.g., power spikes, because with anti-throttle FSC control, fan speed can increase faster than traditional relative FSC algorithms. In iterations of step 1055, the fan speed may quickly approach or attain theoretical PWM ($PWM_t$) through successive iterations of step 1055. In step 1055, fan speed with increase faster than the PWM increment ($\Delta PWM_{np}$) when current PWM ($PWM_n$) is much less than theoretical PWM ($PWM_t$), and with higher Delta Coefficient D. In step 1055, difference-based PWM ($PWM_a$) is intended to increase fan speed faster under various conditions, but not in all cases. In the cases where it may be acceptable or preferable to overshoot theoretical PWM, for example, an extreme need to increase PWM, step 1055 provides increased PWM ($PWM_b$).

While the above discussion describes in detail computer component cooling by operating a fan in a forced air cooling systems, the same concepts may be applied to liquid cooling systems using water pumps as well. For example, the pumps in a liquid cooling system may be modulated based on measurements in component power consumption as well as component and ambient temperature readings. In other words, the intelligent controls that estimate potential temperature increases and decreases to determine fan speed can be equally applied to water pumps their control of flow of liquid through the liquid cooling system.

The functions described above related to the electronic system can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network and a wide area network, an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A method for controlling cooling in a computing device, the method comprising:
   receiving, by a processor, a first measurement of power consumption of at least one component within the computing device;
   determining, by the processor, a first targeted setting for a cooling flow speed of a cooling system within the computing device based at least in part on the received first measurement of power consumption of at least one component within the computing device, the setting managing a sub-system that controls the cooling flow speed of the cooling system for the component within the computing device, the first targeted setting causing the component within the computing device to have a first thermal margin within a target range, the first thermal margin being a difference between a temperature of the component within the computing device when the cooling system is operating at the first targeted setting and a maximum operating temperature of the component within the computing device;
   identifying, by the processor, a first current setting of the cooling flow speed;
   determining, by the processor, a first next setting for the cooling flow speed based on a difference between the first targeted setting and the first current setting, the first next setting having a value between the first current setting and the first targeted setting;
   controlling, by the processor, the cooling flow speed based on the first next setting for the cooling flow speed; and
   iteratively adjusting the cooling flow speed of the cooling system by, for each time step after the controlling the cooling flow speed based on the first next setting, determining another targeted setting for the cooling flow speed, determining another next setting for the cooling flow speed, the other next setting being between the other targeted setting and a current setting for a current time step, and controlling the cooling flow speed based on the other next setting for the current time step.

2. The method of claim 1, the iteratively adjusting the cooling flow speed further comprising:
   receiving, by the processor, a second measurement of power consumption of the at least one component within the computing device, the second measurement of power consumption being received at a set increment of time after the first measurement of power consumption was received;
   determining, by the processor, the other targeted setting for the cooling flow speed based at least in part on the received second measurement of power consumption, the other targeted setting representing a second cooling flow speed of the cooling system for causing the component within the computing device to have the first thermal margin within the target range;
   identifying, by the processor, the first next setting as a second current setting of the cooling flow speed; and
   determining, by the processor, the other next setting for the cooling flow speed based on a difference between the other targeted setting and the second current setting.

3. The method of claim 1, wherein the determining a first next setting for the cooling flow speed based on a difference between the first targeted setting and the first current setting includes subtracting the first current setting from the first targeted setting to obtain the difference and multiplying the difference by a factor.

4. The method of claim 1, the method further comprising:
determining, by the processor, a first amount of heat expected to be generated by the at least one component within the computing device based on the received first measurement of power consumption; and
determining, by the processor, the first targeted setting for the cooling flow speed within the computing device also based at least in part on the first amount of heat expected to be generated.

5. The method of claim 1, the method further comprising:
receiving, by the processor, a measurement of component temperature of the component within the computing device subsequent to the controlling the cooling flow speed based on the first next setting for the cooling flow speed;
determining, by the processor, an actual thermal margin based on the received measurement of component temperature and a corresponding predefined maximum component operating temperature; and
controlling, by the processor, the cooling flow speed based on the actual thermal margin.

6. The method of claim 1, wherein controlling, by the processor, the cooling flow speed based on the first next setting for the cooling flow speed includes adjusting, by the processor, at least one fan speed according to the first next setting.

7. The method of claim 1, wherein controlling the cooling flow speed based on the first next setting for the cooling flow speed includes adjusting at least one pump speed according to the first next setting.

8. A system for controlling cooling in a computing device, the system comprising:
one or more processors; and
a non-transitory computer readable medium storing a plurality of instructions, which when executed, cause the one or more processors to:
receive a first measurement of power consumption of at least one component within the computing device;
determine a first targeted setting for a cooling flow speed of a cooling system within the computing device based at least in part on the received first measurement of power consumption of at least one component within the computing device, the setting managing a subsystem that controls the cooling flow speed of the cooling system for the component within the computing device, the first targeted setting causing the component within the computing device to have a first thermal margin within a target range, the first thermal margin being a difference between a temperature of the component within the computing device when the cooling system is operating at the first targeted setting and a maximum operating temperature of the component within the computing device;
identify a first current setting of the cooling flow speed;
determine a first next setting for the cooling flow speed based on a difference between the first targeted setting and the first current setting, the first next setting having a value between the first current setting and the first targeted setting;
control the cooling flow speed based on the first next setting for the cooling flow speed; and
iteratively adjust the cooling flow speed of the cooling system by, for each time step after the controlling the cooling flow speed based on the first next setting, determining another targeted setting for the cooling flow speed, determining another next setting for the cooling flow speed, the other next setting being between the other targeted setting and a current setting for a current time step, and controlling the cooling flow speed based on the other next setting for the current time step.

9. The system of claim 8, the instructions to iteratively adjust the cooling flow speed comprising instructions that, when executed, further cause the one or more processors to:
receive a second measurement of power consumption of the at least one component within the computing device, the second measurement of power consumption being received at a set increment of time after the first measurement of power consumption was received;
determine the other targeted setting for the cooling flow speed based at least in part on the received second measurement of power consumption, the other targeted setting representing a cooling flow speed of the cooling system for causing the component within the computing device to have the first thermal margin within the target range;
identify the first next setting as a second current setting of the cooling flow speed; and
determine the other next setting for the cooling flow speed based on a difference between the second targeted setting and the second current setting.

10. The system of claim 8, wherein determining a first next setting for the cooling flow speed based on a difference between the first targeted setting and the first current setting includes subtracting the first current setting from the first targeted setting to obtain the difference and multiplying the difference by a factor.

11. The system of claim 8, wherein the plurality of instructions, when executed further cause the one or more processors to:
determine a first amount of heat expected to be generated by the at least one component within the computing device based on the received first measurement of power consumption; and
determine the first targeted setting for the cooling flow speed within the computing device also based at least in part on the first amount of heat expected to be generated.

12. The system of claim 8, wherein the plurality of instructions, when executed further cause the one or more processors to:
receive a measurement of component temperature of the component within the computing device subsequent to the control the cooling flow speed based on the first next setting for the cooling flow speed;
determine an actual thermal margin based on the received measurement of component temperature and a corresponding at least one predefined maximum component operating temperature; and
control the cooling flow speed based on the actual thermal margin.

13. The system of claim 8, wherein controlling the cooling flow speed based on the first next setting for the cooling flow speed includes adjusting at least one fan speed according to the first next setting.

14. The system of claim 8, wherein controlling the cooling flow speed based on the first next setting for the cooling flow speed includes adjusting at least one pump speed according to the first next setting.

15. A computer program product, comprising a non-transitory computer-readable medium having a computer-readable program code embodied therein to be executed by one or more processors, the program code including instructions to:

receive a first measurement of power consumption of at least one component within the computing device;

determine a first targeted setting for a cooling flow speed of a cooling system within the computing device based at least in part on the received first measurement of power consumption of at least one component within the computing device, the setting managing a subsystem that controls the cooling flow speed of the cooling system for the component within the computing device, the first targeted setting causing the component within the computing device to have a first thermal margin within a target range, the first thermal margin being a difference between a temperature of the component within the computing device when the cooling system is operating at the first targeted setting and a maximum operating temperature of the component within the computing device;

identify a first current setting of the cooling flow speed;

determine a first next setting for the cooling flow speed based on a difference between the first targeted setting and the first current setting, the first next setting having a value between the first current setting and the first targeted setting;

control the cooling flow speed based on the first next setting for the cooling flow speed; and iteratively adjust the cooling flow speed of the cooling system by, for each time step after the controlling the cooling flow speed based on the first next setting, determining another targeted setting for the cooling flow speed, determining another next setting for the cooling flow speed, the other next setting being between the other targeted setting and a current setting for a current time step, and controlling the cooling flow speed based on the other next setting for the current time step.

16. The computer program product of claim 15, the instructions to iteratively adjust the cooling flow speed including further instructions to:

receive a second measurement of power consumption of the at least one component within the computing device, the second measurement of power consumption being received at a set increment of time after the first measurement of power consumption was received;

determine the other targeted setting for the cooling flow speed based at least in part on the received second measurement of power consumption, the other targeted setting representing a cooling flow speed of the cooling system for causing the component within the computing device to have the first thermal margin within the target range;

identify the first next setting as a second current setting of the cooling flow speed; and determine the other next setting for the cooling flow speed based on a difference between the other targeted setting and the second current setting.

17. The computer program product of claim 15, wherein determining a first next setting for the cooling flow speed based on a difference between the first targeted setting and the first current setting includes subtracting the first current setting from the first targeted setting to obtain the difference and multiplying the difference by a factor.

18. The computer program product of claim 15, the program code including further instructions to:

determine a first amount of heat expected to be generated by the at least one component within the computing device based on the received first measurement of power consumption; and determine the first targeted setting for the cooling flow speed within the computing device also based at least in part on the first amount of heat expected to be generated.

19. The computer program product of claim 15, the program code including further instructions to:

receive a measurement of component temperature of the component within the computing device subsequent to the control the flow based on the first next setting for the cooling flow speed;

determine an actual thermal margin based on the received measurement of component temperature and a corresponding at least one predefined maximum component operating temperature; and control the cooling flow speed based on the actual thermal margin.

20. The computer program product of claim 15, wherein controlling the cooling flow speed based on the first next setting for the cooling flow speed includes adjusting at least one fan speed according to the first next setting.

* * * * *